(12) United States Patent
Lin et al.

(10) Patent No.: US 9,929,133 B2
(45) Date of Patent: Mar. 27, 2018

(54) SEMICONDUCTOR LOGIC CIRCUITS FABRICATED USING MULTI-LAYER STRUCTURES

(71) Applicant: Taiwan Semiconductor Manufacturing Company Limited, Hsinchu (TW)

(72) Inventors: Yi-Tang Lin, Hsinchu (TW); Clement Hsingjen Wann, New York, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 131 days.

(21) Appl. No.: 14/010,648

(22) Filed: Aug. 27, 2013

(65) Prior Publication Data

US 2015/0061026 A1  Mar. 5, 2015

(51) Int. Cl.
| | |
|---|---|
| *H01L 27/02* | (2006.01) |
| *H01L 21/8234* | (2006.01) |
| *H01L 23/522* | (2006.01) |
| *H01L 27/092* | (2006.01) |
| *H01L 27/06* | (2006.01) |
| *H03K 19/20* | (2006.01) |

(52) U.S. Cl.
CPC .. *H01L 27/0207* (2013.01); *H01L 21/823431* (2013.01); *H01L 21/823475* (2013.01); *H01L 27/0688* (2013.01); *H03K 19/20* (2013.01)

(58) Field of Classification Search
CPC ..... H01L 21/823807; H01L 21/823842; H01L 27/092; H01L 21/823814; H01L 27/11; H01L 21/823431; H01L 21/823475; H01L 27/0688; H01L 27/0207; H03K 19/20
See application file for complete search history.

(56) References Cited

U.S. PATENT DOCUMENTS 4,939,568 A * 7/1990 Kato ................ H01L 21/6835
  257/686
5,355,022 A * 10/1994 Sugahara ........... H01L 21/2007
  257/506

(Continued)

FOREIGN PATENT DOCUMENTS

| KR | 10-0684894 | 2/2007 |
| KR | 10-2010-0063993 | 6/2010 |

OTHER PUBLICATIONS

Chinese Office Action; Application No. 201310594649.6; dated Oct. 20, 2016.

*Primary Examiner* — Allen Parker
*Assistant Examiner* — Long H Le
(74) *Attorney, Agent, or Firm* — Jones Day

(57) ABSTRACT

Systems and methods are provided for fabricating a semiconductor device structure. An example semiconductor device structure includes a first device layer, a second device layer and an inter-level connection structure. The first device layer is formed on a substrate and includes a first semiconductor device, the first semiconductor device including a first electrode structure. The second device layer is formed on the first device layer and includes a second semiconductor device, the second semiconductor device including a second electrode structure. The first inter-level connection structure includes one or more first conductive materials and is configured to electrically connect to the first electrode structure and the second electrode structure.

20 Claims, 26 Drawing Sheets

(56) References Cited

U.S. PATENT DOCUMENTS

| | | | | |
|---|---|---|---|---|
| 5,612,552 A | * | 3/1997 | Owens | H01L 27/0688 257/202 |
| 2001/0005059 A1 | * | 6/2001 | Koyanagi | H01L 21/8221 257/778 |
| 2003/0141504 A1 | * | 7/2003 | Kuwabara | H01L 27/1214 257/66 |
| 2006/0234487 A1 | | 10/2006 | Kim et al. | |
| 2008/0283838 A1 | * | 11/2008 | Ishikawa | G02F 1/1368 257/59 |
| 2009/0121260 A1 | * | 5/2009 | Bernstein | H01L 21/6835 257/255 |
| 2009/0224364 A1 | * | 9/2009 | Oh | H01L 21/2007 257/532 |
| 2010/0140608 A1 | | 6/2010 | Park et al. | |
| 2010/0190334 A1 | * | 7/2010 | Lee | H01L 21/2007 438/637 |

* cited by examiner (e)

(f)

(e)

(f)

SEMICONDUCTOR LOGIC CIRCUITS FABRICATED USING MULTI-LAYER STRUCTURES

FIELD

The technology described in this patent document relates generally to semiconductor device structures and more particularly to multi-layer structures.

BACKGROUND

Conventional integrated circuits (IC) technology is often implemented to integrate multiple semiconductor devices, such as transistors, at approximately a same level on a single integrated-circuit (IC) chip.

SUMMARY

In accordance with the teachings described herein, systems and methods are provided for fabricating a semiconductor device structure. An example semiconductor device structure includes a first device layer, a second device layer and an inter-level connection structure. The first device layer is formed on a substrate and includes a first semiconductor device, the first semiconductor device including a first electrode structure. The second device layer is formed on the first device layer and includes a second semiconductor device, the second semiconductor device including a second electrode structure. The first inter-level connection structure includes one or more first conductive materials and is configured to electrically connect to the first electrode structure and the second electrode structure.

In one embodiment, a method is provided for fabricating a semiconductor device structure. For example, a first device layer including a first semiconductor device is formed on a substrate. The first semiconductor device includes a first electrode structure. An inter-level connection structure including one or more conductive materials is formed. The inter-level connection structure is electrically connected to the first electrode structure. A second device layer including a second semiconductor device is formed on the first device layer. The second semiconductor device includes a second electrode structure electrically connected to the inter-level connection structure.

DETAILED DESCRIPTION

The fabrication of different semiconductor devices at a same level on an IC chip may have some disadvantages. As an example, various process steps may be needed for fabricating different semiconductor devices, and the fabrication costs may often increase with the number of devices to be integrated on a single chip. Also, as the size of individual devices and the spacing between the devices continue to decrease, lithography processes usually become more and more expensive. Furthermore, it is often difficult to fabricate devices, such as N-channel transistors and P-channel transistors, with different channel materials on a same substrate at a same time.

Figure 1A:
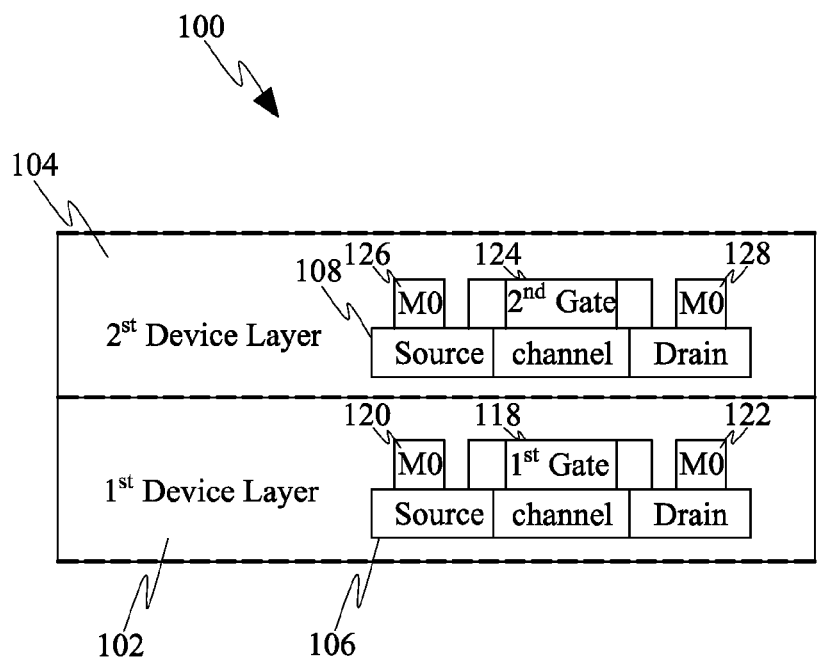
FIG. 1(A) depicts an example diagram of a multi-layer semiconductor device structure.

FIG. 1(A) depicts an example diagram of a multi-layer semiconductor device structure. As shown in FIG. 1(A), the semiconductor device structure 100 may include multiple device layers (e.g., the layers 102 and 104) which may be used to fabricate semiconductor devices, such as planar metal-oxide-semiconductor field effect transistors (MOSFETs), FinFETs, bipolar junction transistors, diodes, capacitors, etc. Transistors 106 and 108 may be fabricated in the device layers 102 and 104, respectively. The transistor 106 may include a gate electrode structure 118, a source electrode structure 120 and a drain electrode structure 122, and the transistor 108 may include a gate electrode structure 124, a source electrode structure 126 and a drain electrode structure 128. For example, the gate electrode structure 118, the source electrode structure 120 and the drain electrode structure 122 may include polycrystalline silicon or metals (e.g., Al, W, Cu).

Figure 1B:
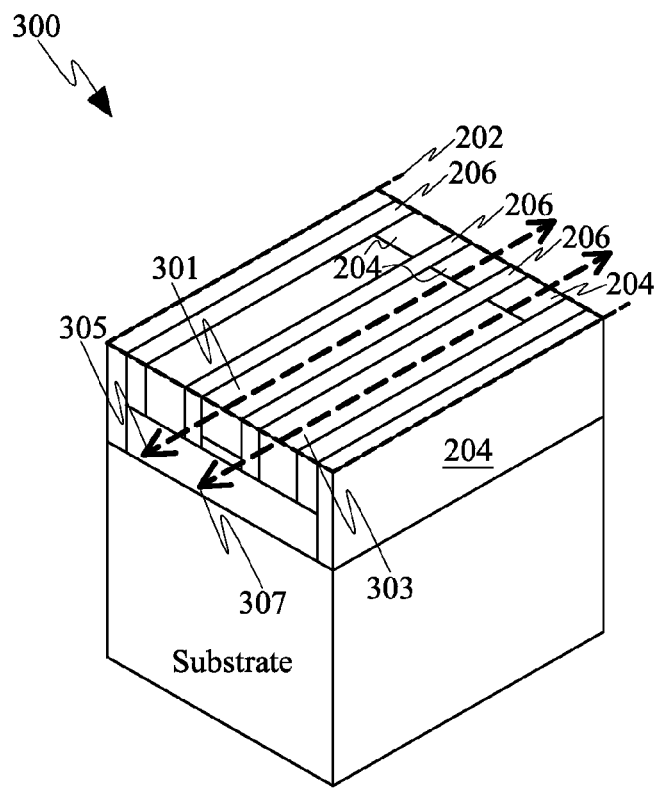
FIG. 1(B) depicts an example diagram showing certain components of a multi-layer semiconductor device structure.
Figure 1C:
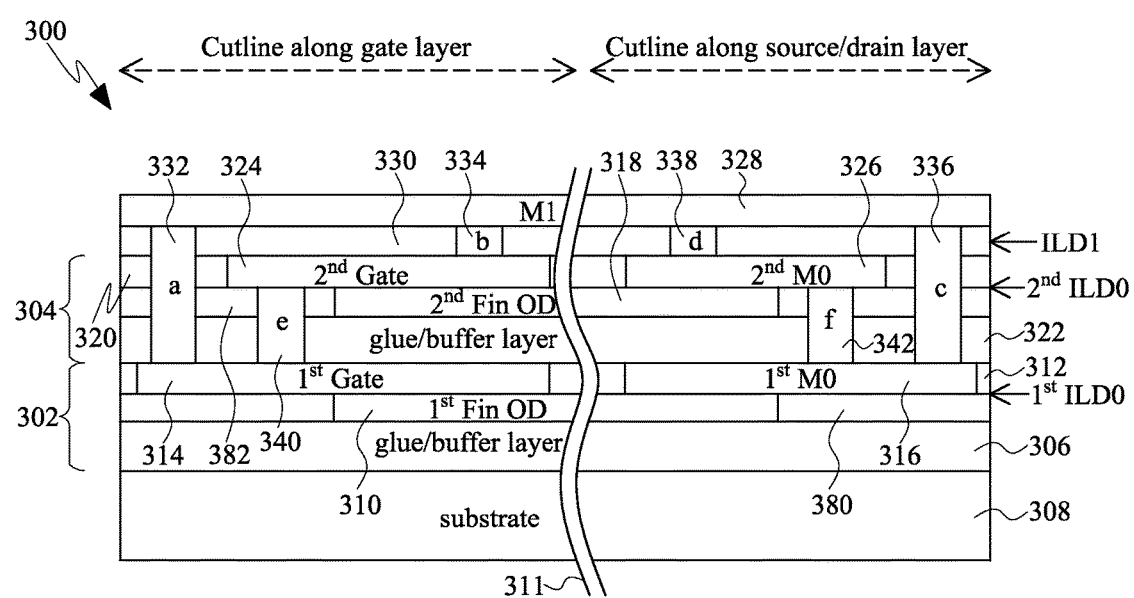
FIG. 1(C) depicts cross-sectional views of the multi-layer semiconductor device structure as shown in FIG. 1(B).

FIG. 1(B) depicts an example diagram showing certain components of a multi-layer semiconductor device structure. As shown in FIG. 1(B), the multi-layer semiconductor device structure 300 includes at least a gate structure 301 and one or more source/drain structures 303. Cross-sectional views of the multi-layer semiconductor device structure 300 along two cutlines 305 and 307 are shown in FIG. 1(C). As shown in FIG. 1(C), a separation line 311 divides the diagram into a left part and a right part. The cross-sectional view of the multi-layer semiconductor device structure 300 along the cutline 305 is shown in the left part of FIG. 1(C), and the cross-sectional view of the multi-layer semiconductor device structure 300 along the cutline 307 is shown in the right part of FIG. 1(C).

The multi-layer semiconductor device structure 300 includes a first device layer 302 and a second device layer 304. A glue/buffer layer 306 may be formed on a substrate 308 as the base material for semiconductor devices in the first device layer 302, and a first fin structure for oxidation and diffusion 310 and a first inter-layer dielectric (ILD) layer 312 may be formed on top of the glue/buffer layer 306. A first gate layer 314 and a first source/drain layer 316 may be formed to connect with gate electrodes and source/drain electrodes of transistors in the first device layer 302, respectively. An isolation layer 380 may be formed on the glue/buffer layer 306. For example, the glue/buffer layer 306 may include aluminum oxide, hafnium oxide, and silicon oxide.

In the second device layer 304, a second fin structure for oxidation and diffusion 318 and a second ILD layer 320 may be formed on top of another glue/buffer layer 322. In addition, a second gate layer 324 and a second source/drain layer 326 may be formed to connect with gate electrodes and source/drain electrodes of transistors in the second device layer 304, respectively. An isolation layer 382 may be formed on the glue/buffer layer 322.

In some embodiments, the second fin structure for oxidation and diffusion 318 may be parallel to the first fin structure for oxidation and diffusion 310. The second gate layer 324 may be parallel to the first gate layer 314. The second source/drain layer 326 may be parallel to the first source/drain layer 316. The length of the first gate layer 314 may be substantially the same as the first source/drain layer 316. Further, the length of second gate layer 324 may be substantially shorter than that of the second source/drain layer 326.

Moreover, a conductive layer 328 (e.g., crystalline polysilicon or metals) may be formed on an ILD layer 330 through one or more back-end-of-line (BEOL) processes. As shown in FIG. 1(C), multiple inter-level connection structures 332, 334, 336, 338, 340 and 342 (e.g., vias) may be formed for interconnection of semiconductor devices in the first device layer 302 and the second device layer 304. For example, the first gate layer 314, the first source/drain layer 316, the second gate layer 324 and the second source/drain layer 326 include conductive layers. The glue/buffer layers 306 and 322, and the ILD layers 312, 320 and 330 include dielectric layers. The inter-level connection structures 332, 334, 336, 338, 340 and 342 include one or more conductive materials (e.g., W, Al, Cu). The inter-level connection structures 332, 334, 336, 338, 340 and 342 may each represent a particular type of inter-level connection. For example, the inter-level connection structure 332 represents a type of inter-level connection structure which penetrates the second device layer 304 and part of the ILD layer 330 and connects the conductive layer 328 with the first gate layer 314. The inter-level connection structure 340 represents another type of inter-level connection structure which penetrates part of the second device layer and connects the first gate layer 314 with the second gate layer 324. The inter-level connection structures 332, 334, 336, 338, 340 and 342 may each include one or more components which may or may not be physically connected. In some embodiments, the multi-layer semiconductor device structure 300 may include more than two device layers, and each device layer may include multiple semiconductor devices, such as transistors, diodes, and capacitors.

Logic units, such as an inverter (i.e., a NOT gate), a NAND gate, and a NOR gate, may be fabricated using the multi-layer semiconductor device structure 300 based on different layout designs. FIGS. 2(A)-2(G) depict example diagrams of an inverter fabricated using the multi-layer semiconductor device structure 300. FIGS. 3(A)-3(G) depict example diagrams of a NAND gate fabricated using the multi-layer semiconductor device structure 300. FIGS. 4(A)-4(G) depict example diagrams of a NOR gate fabricated using the multi-layer semiconductor device structure 300.

Figure 2A:
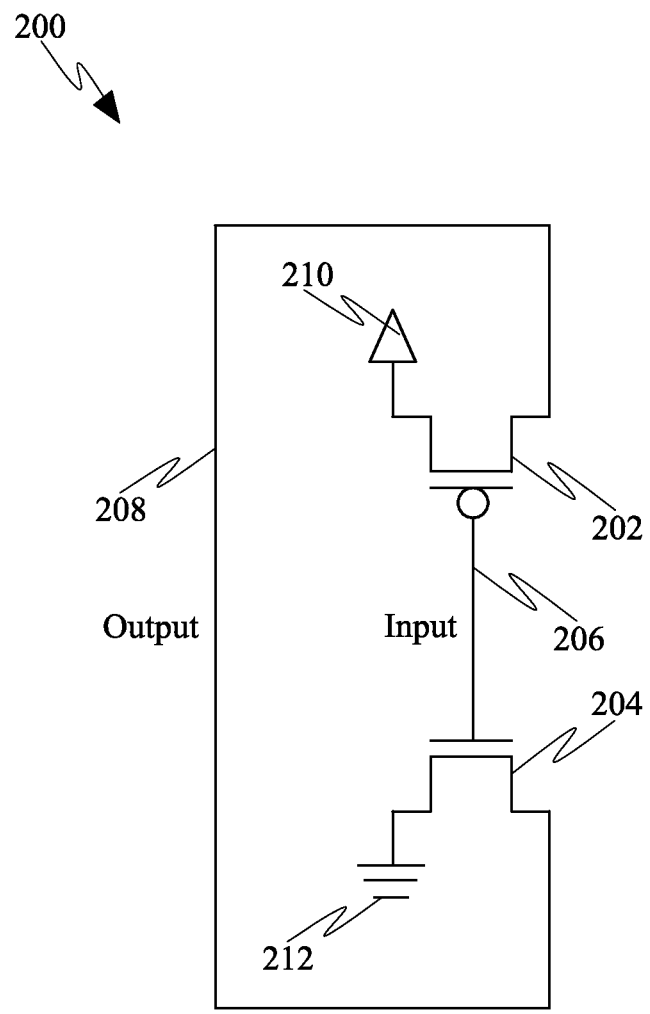
FIGS. 2(A)-2(G) depict example diagrams of an inverter fabricated using a multi-layer semiconductor device structure.

FIG. 2(A) depicts an example schematic diagram of an inverter. As shown in FIG. 2(A), the inverter 200 includes a P-channel transistor 202 (e.g., a P-channel MOSFET) and a N-channel transistor 204 (e.g., a N-channel MOSFET). The P-channel transistor 202 and the N-channel transistor 204 may each include a gate electrode associated with a gate electrode structure, a source electrode associated with a source region, and a drain electrode associated with a drain region. The gate electrode of the P-channel transistor 202 may be configured to electrically connect to the gate electrode of the N-channel transistor 204 and receive an input signal 206. The drain electrode of the P-channel transistor 202 or the drain electrode of the N-channel transistor 204 may be configured to generate an output signal 208 in response to the input signal 206. The source electrode of the P-channel transistor 202 may be biased at a predetermined voltage 210 (e.g., VDD), and the source electrode of the N-channel transistor 204 may be biased at another predetermined voltage 212 (e.g., VSS). For example, the voltage 210 may be higher than the voltage 212.

Table 1 shows a truth table for the inverter 200, where the output signal 208 corresponds to a logic value (e.g., 0, 1) different from the input signal 206.

TABLE 1

| Input | Output |
|-------|--------|
| 0     | 1      |
| 1     | 0      |

Referring to FIG. 1(C) and FIG. 2(A), the P-channel transistor 202 may be fabricated in the first device layer 302. As an example, the glue/buffer layer 306 may serve as the base material for the P-channel transistor 202. The first gate layer 314 may be configured to electrically connect to the gate electrode of the P-channel transistor 202, and the first source/drain layer 316 may be configured to electrically connect to the source/drain electrode of the P-channel transistor 202. In addition, the N-channel transistor 204 may be fabricated in the second device layer 304. The second gate layer 324 may be configured to electrically connect to the gate electrode of the N-channel transistor 204, and the second source/drain layer 326 may be configured to electrically connect to the source/drain electrode of the N-channel transistor 204. The inter-level connection structures 332, 334, 336, 338, 340 and 342 (e.g., vias) may be used for interconnection of the N-channel transistor 204 and the P-channel transistor 202.

Figure 2B:
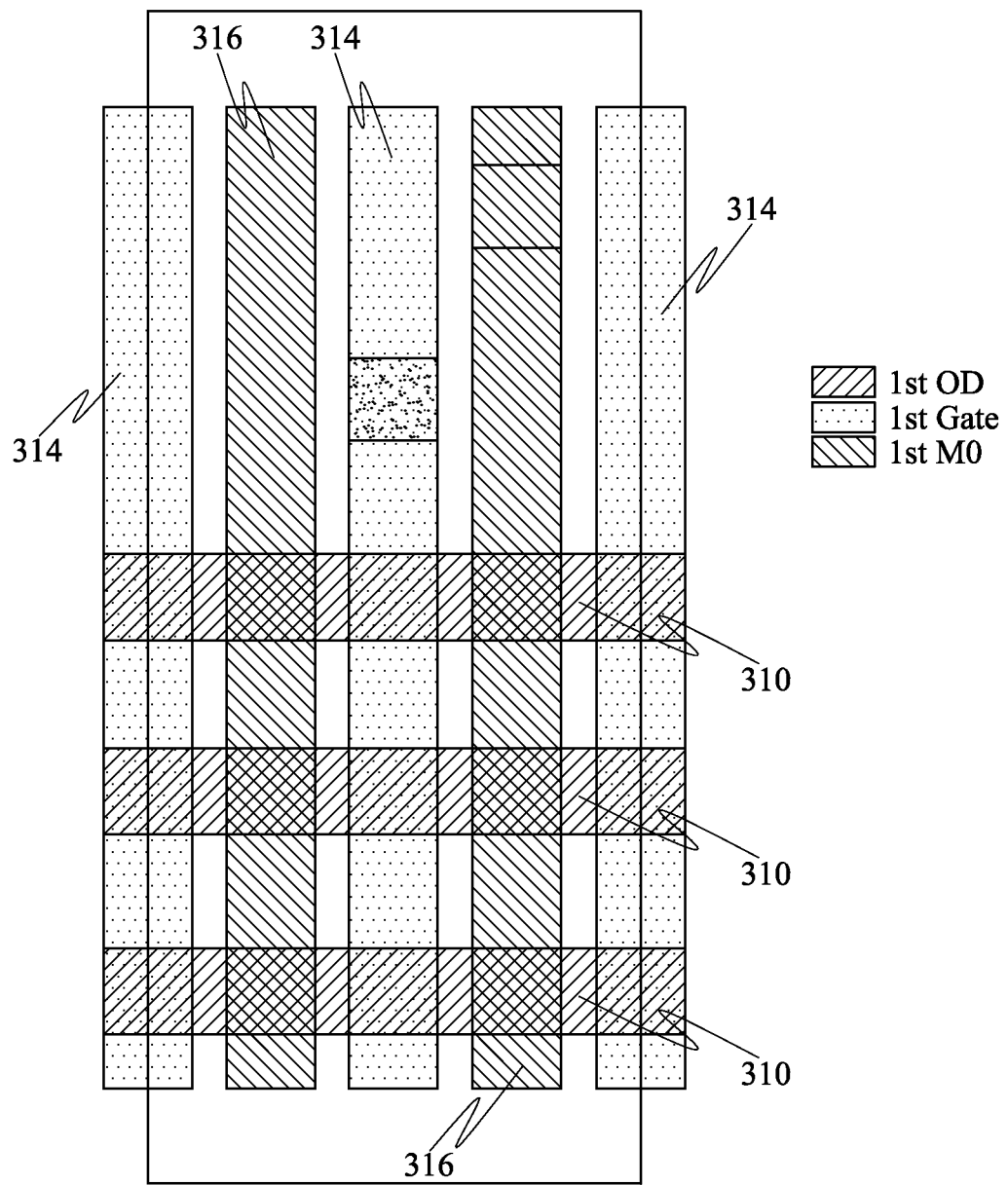

FIG. 2(B) depicts an example layout diagram of the first device layer 302 for fabricating the inverter 200. As shown in FIG. 2(B), the first gate layer 314 may include three components separated by two components of the first source/drain layer 316. The first gate layer 314 and the first source/drain layer 316 may extend along a same direction. The first fin structure for oxidation and diffusion 310 may include three components and extend along a direction different from (e.g., perpendicular to) that of the first gate layer 314 and the first source/drain layer 316.

Figure 2C:
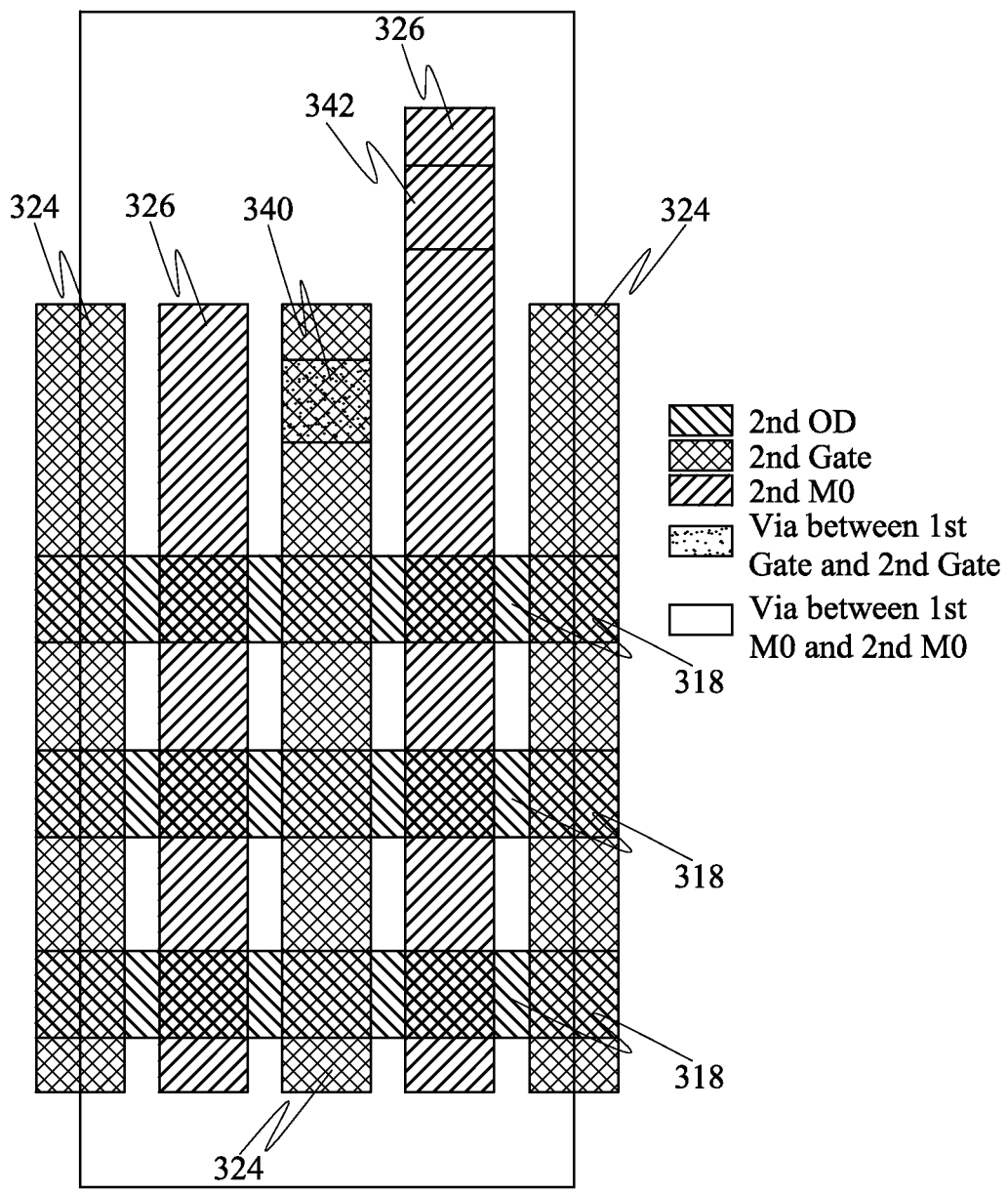

FIG. 2(C) depicts an example layout diagram of the second device layer 304 for fabricating the inverter 200. As shown in FIG. 2(C), three components of the second gate layer 324 may be separated by two components of the second source/drain layer 326. The second fin structure for oxidation and diffusion 318 may include three components and extend along a direction different from (e.g., perpendicular to) that of the second gate layer 314 and the second source/drain layer 326. The inter-level connection structure 340 may be configured to electrically connect the first gate layer 314 and the second gate layer 324 together, and the inter-level connection structure 342 may be configured to electrically connect the first source/drain layer 316 and the second source/drain layer 326 together.

Figure 2D:
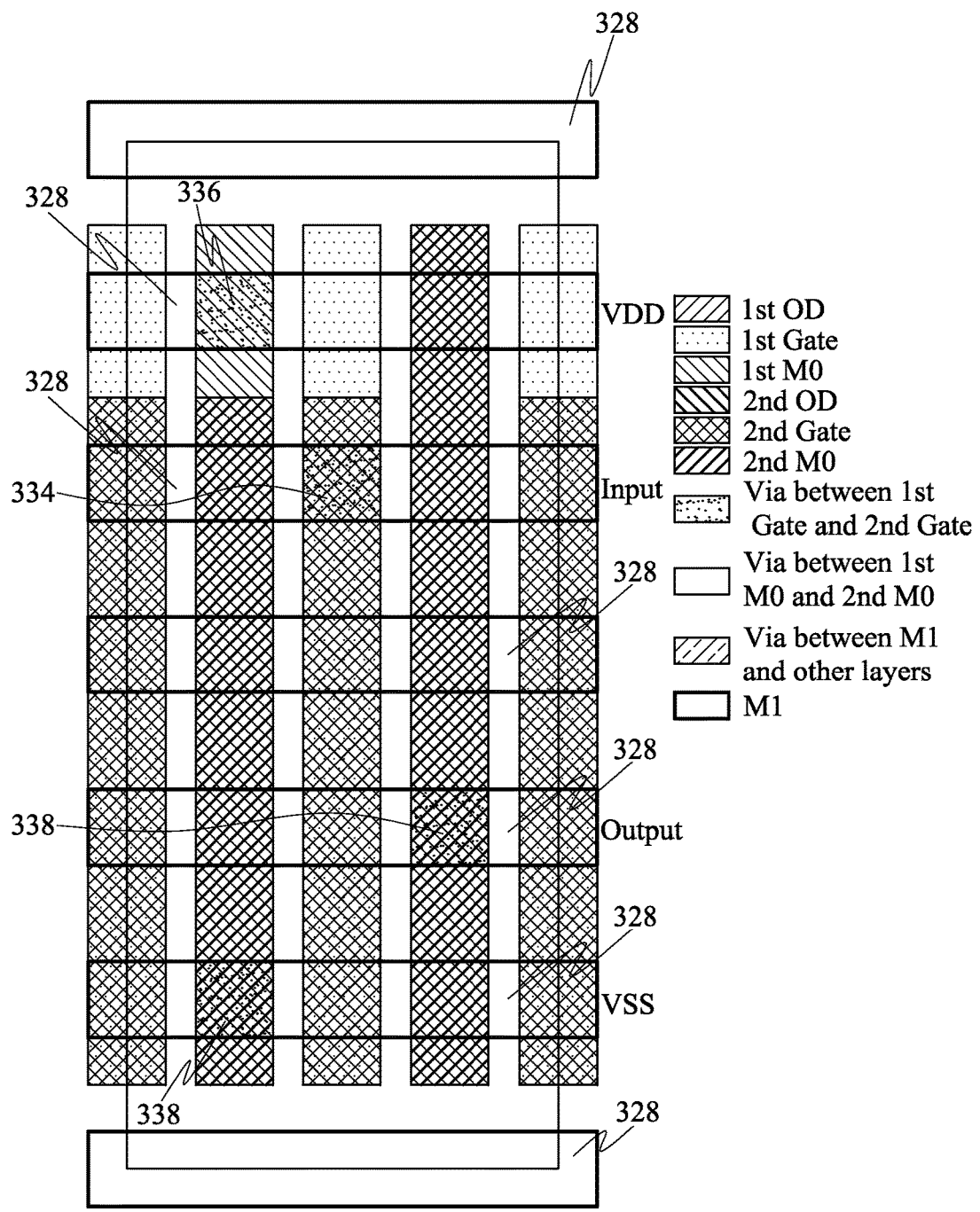

FIG. 2(D) depicts an example layout diagram of the conductive layer 328 for fabricating the inverter 200. As shown in FIG. 2(D), the conductive layer 328 may be formed for interconnection of the N-channel transistor 204 and the P-channel transistor 202. For example, the inter-level connection structure 334, 336 and 338 may be configured to electrically connect to the second gate layer 324, the first source/drain layer 316, and the second source/drain layer 326, respectively. The inter-level connection structure 334 may correspond to a terminal for receiving the input signal 206 (e.g., Input). Further, the inter-level connection structure 336 may correspond to a terminal for receiving the bias voltage 210 (e.g., VDD), and the inter-level connection structure 338 may correspond to a terminal for receiving the bias voltage 212 (e.g., VSS) or a terminal for providing the output signal 208 (e.g., Output).

Figure 2E:
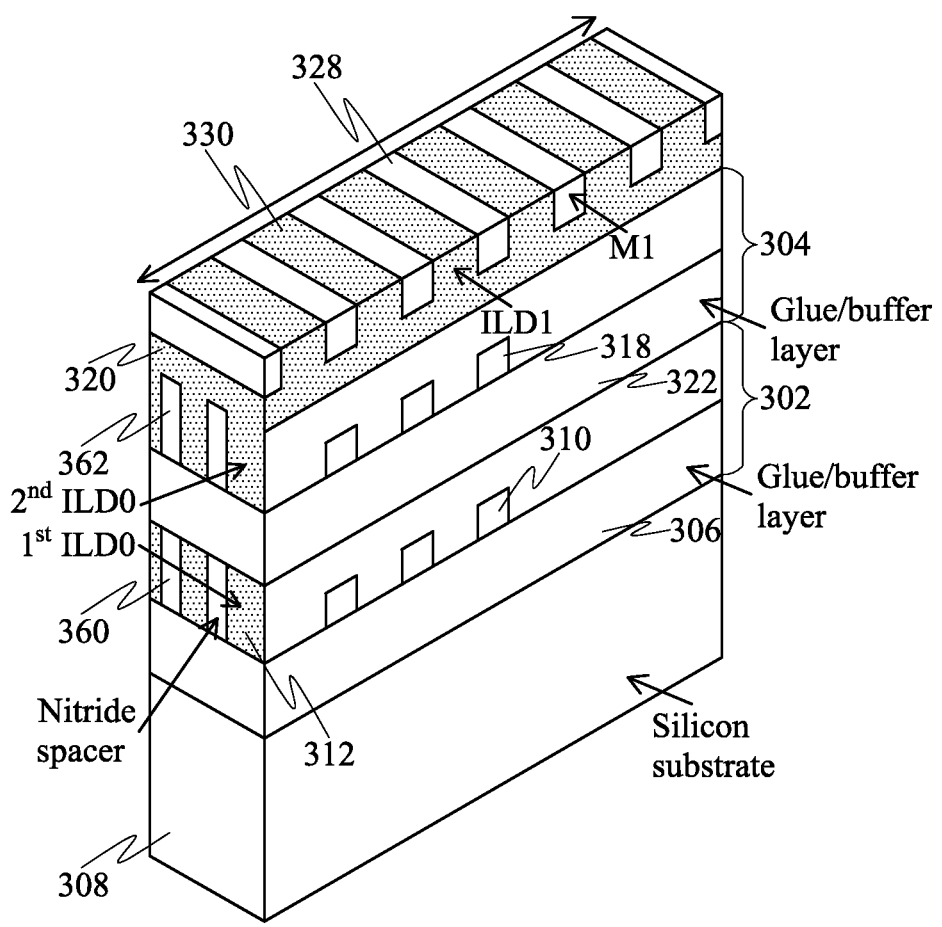

FIG. 2(E) depicts an example diagram showing a cross-section view of the multi-layer structure 300 for fabricating the inverter 200. As shown in FIG. 2(E), in the first device layer 302, three fin structures for oxidation and diffusion (e.g., the fin structure 310) may be formed on the glue/buffer layer 306. One or more spacers 360 (e.g., silicon nitride) may be formed, for example, to protect gate electrode structures of transistors within the first device layer 302. Furthermore, in the second device layer 304, three fin structures for oxidation and diffusion (e.g., the fin structure 318) may be formed on the glue/buffer layer 322, and one or more spacers 362 may be formed to protect gate electrode structures of transistors. The conductive layer 328 may include six components separated by the ILD layer 330.

Figure 2F:
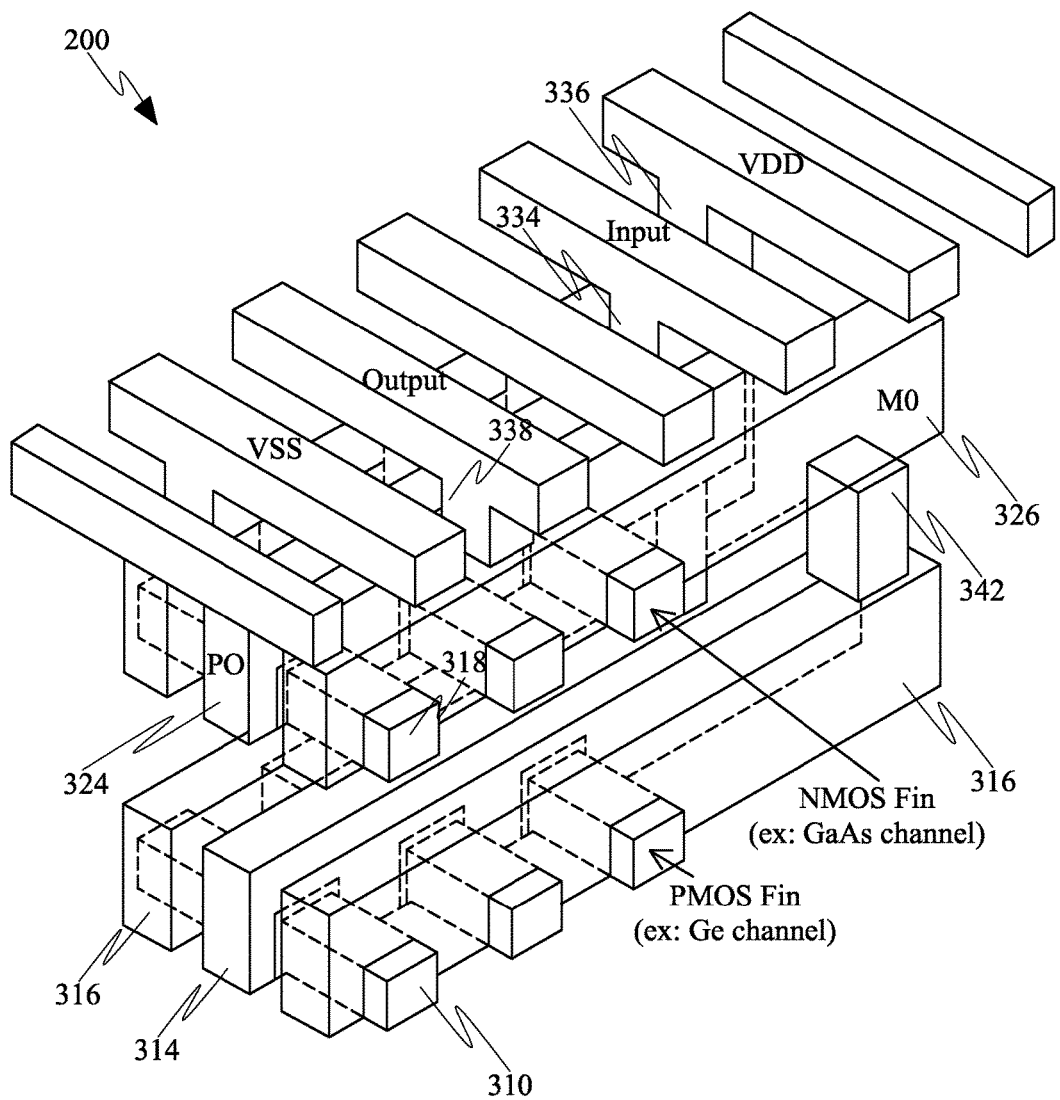

FIG. 2(F) depicts an example diagram showing certain components within the multi-layer structure 300 for fabricating the inverter 200. As shown in FIG. 2(F), three PMOS fin structures (e.g., the fin structure 310) may be formed, for example, including a germanium channel. The first gate layer 314 and the first source/drain layers 316 may extend substantially over the PMOS fin structures so that three P-channel transistors may be formed at an approximately same level. At a higher level, three NMOS fin structures (e.g., the fin structure 318) may be formed, for example, including a gallium arsenide channel. The second gate layer 324 and the second source/drain layers 326 may extend substantially over the NMOS fin structures to form three N-channel transistors at the higher level. Multiple inter-level connection structures (e.g., the inter-level connection structures 334, 336, 338 and 342) are formed for interconnection of the N-channel transistors and the P-channel transistors at different levels.

Figure 2G:
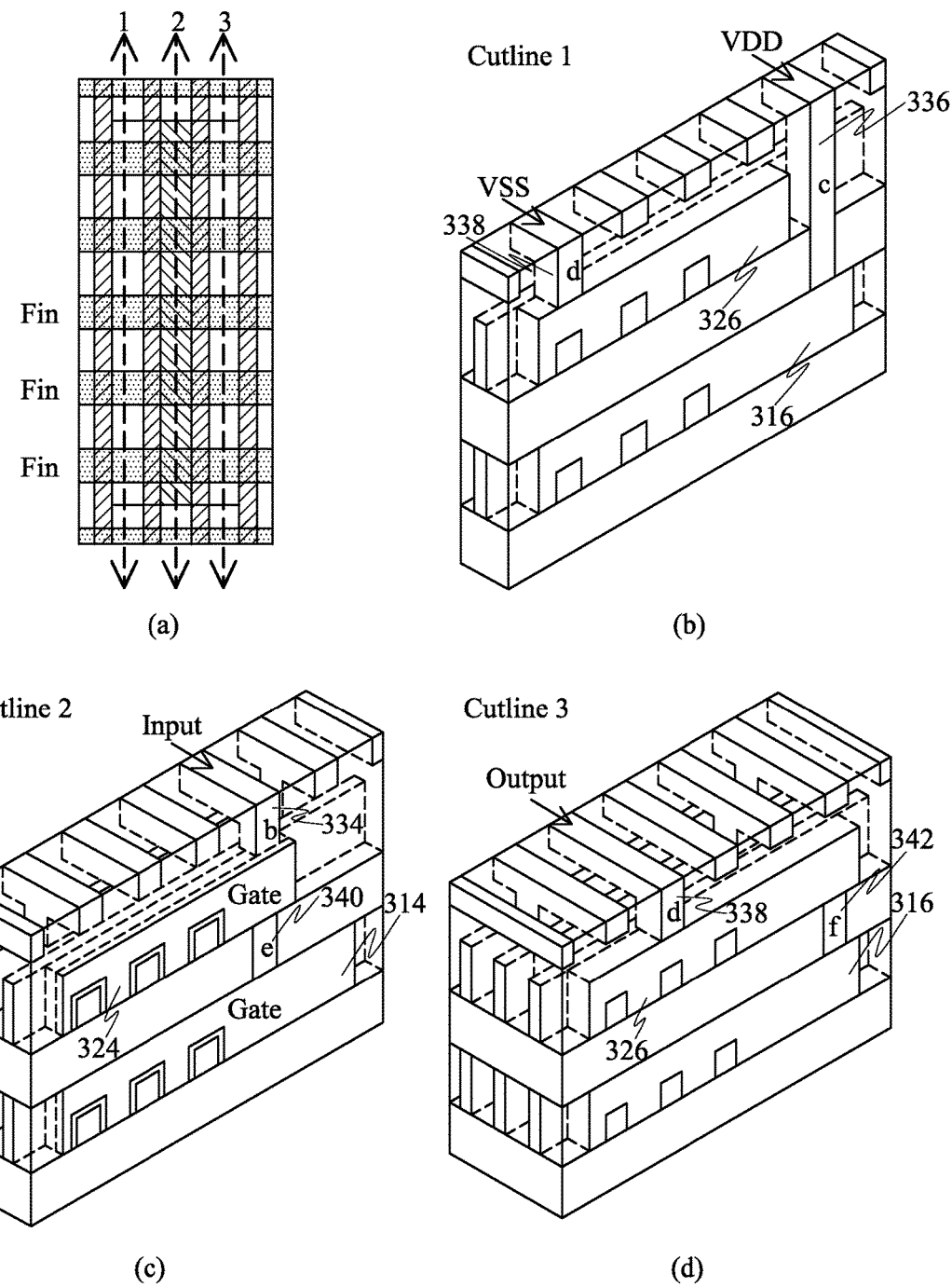

FIG. 2(G) depicts example diagrams showing cross-section views of the multi-layer structure 300 for fabricating the inverter 200 corresponding to cross-sections taken along different lines. FIG. 2(G)(a) shows three different lines for cross-section views on a layout of the multi-layer structure 300. For example, the layout of the multi-layer structure 300 as shown in FIG. 2(G)(a) may include a combination or superimposition of the layout diagrams shown in FIG. 2(B), FIG. 2(C), and FIG. 2(D).

A cross-section view corresponding to a cross-section taken along line "1" is shown in FIG. 2(G)(b). The inter-level connection structure 336 may connect to the first source/drain layer 316 and correspond to a terminal for receiving the bias voltage 210 (e.g., VDD). Also, the inter-level connection structure 338 may connect to the second source/drain layer 316 and correspond to a terminal for receiving the bias voltage 212 (e.g., VSS). For example, the first source/drain layer 316 may be configured to electrically connect to the source electrode of the P-channel transistor 202 as shown in FIG. 2(A). In another example, the second source/drain layer 326 may be configured to electrically connect to the source electrode of the N-channel transistor 204 as shown in FIG. 2(A).

FIG. 2(G)(c) shows a cross-section view corresponding to a cross-section taken along line "2." The inter-level connection structure 340 may connect the first gate layer 314 and the second gate layer 324 together. In addition, the inter-level connection structure 334 may connect to the second gate layer 324 and correspond to a terminal for receiving the input signal 206 (e.g., Input). For example, the first gate layer 314 may be configured to electrically connect to the gate electrode of the P-channel transistor 202, and the second gate layer 324 may be configured to electrically connect to the gate electrode of the N-channel transistor 204 as shown in FIG. 2(A).

Furthermore, a cross-section view corresponding to a cross-section taken along line "3" is shown in FIG. 2(G)(d). The inter-level connection structure 342 may connect the first source/drain layer 316 and the second source/drain layer 326 together. In addition, the inter-level connection structure 338 may connect to the second source/drain layer 326 and correspond to a terminal for providing the output signal 208 (e.g., Output). For example, the first source/drain layer 316 may be configured to electrically connect to the drain electrode of the P-channel transistor 202 as shown in FIG. 2(A). In another example, the second source/drain layer 326 may be configured to electrically connect to the drain electrode of the N-channel transistor 204 as shown in FIG. 2(A).

Figure 3A:
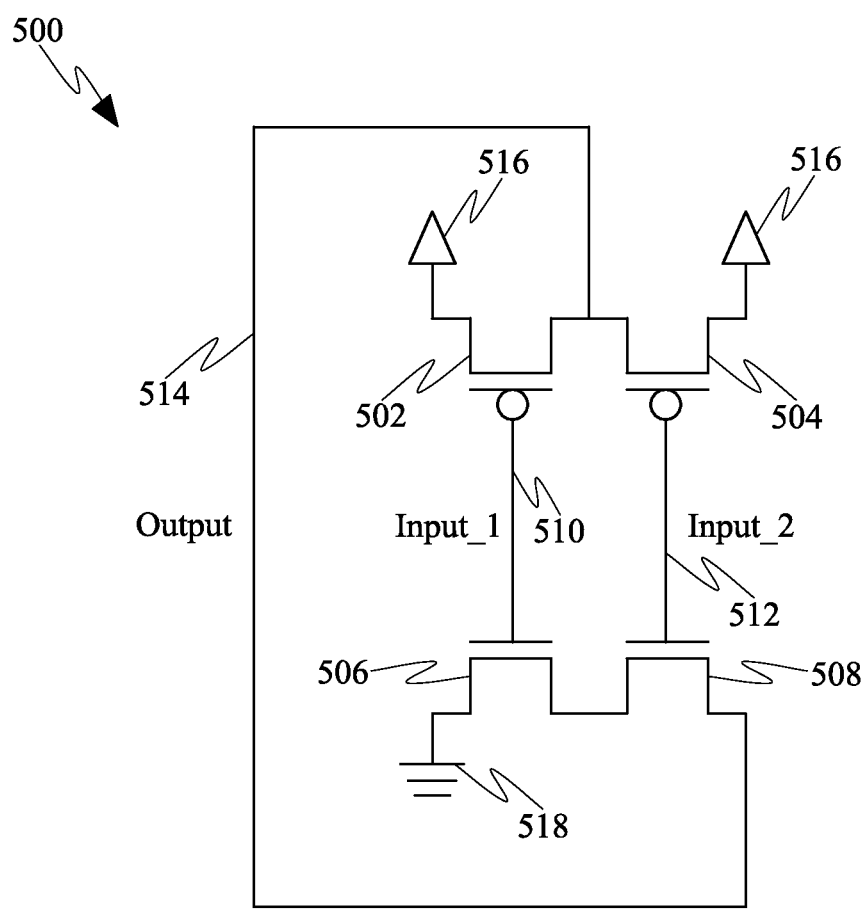
FIGS. 3(A)-3(G) depict example diagrams of a NAND gate fabricated using a multi-layer semiconductor device structure.

FIG. 3(A) depicts an example schematic diagram of a NAND gate. As shown in FIG. 3(A), the NAND gate 500 includes two P-channel transistors 502 and 504 (e.g., P-channel MOSFETs) and two N-channel transistor 506 and 508 (e.g., N-channel MOSFETs). The P-channel transistors 502 and 504 and the N-channel transistors 506 and 508 may each include a gate electrode associated with a gate electrode structure, a source electrode associated with a source region and a drain electrode associated with a drain region. The gate electrode of the P-channel transistor 502 may be configured to electrically connect to the gate electrode of the N-channel transistor 506 and receive an input signal 510 (e.g., Input_1). Also, the gate electrode of the P-channel transistor 504 may be configured to electrically connect to the gate electrode of the N-channel transistor 508 and receive another input signal 512 (e.g., Input_2). An output signal 514 may be generated by the NAND gate 500 in response to the input signals 510 and 512. The source electrodes of the P-channel transistors 502 and 504 may be biased at a predetermined voltage 516 (e.g., VDD), and the source electrode of the N-channel transistor 508 may be biased at another predetermined voltage 518 (e.g., VSS). For example, the voltage 516 may be higher than the voltage 518.

Table 2 shows a truth table for the NAND gate 500, where the output signal 514 corresponds to a logic value (e.g., 0, 1) determined according to the input signals 510 and 512.

TABLE 2

| Input 1 | Input 2 | Output |
|---------|---------|--------|
| 0 | 0 | 1 |
| 0 | 1 | 1 |
| 1 | 0 | 1 |
| 1 | 1 | 0 |

Referring to FIG. 1(C) and FIG. 3(A), the P-channel transistors 502 and 504 may be fabricated in the first device layer 302. As an example, the glue/buffer layer 306 may serve as the base material for the P-channel transistors 502 and 504. The first gate layer 314 may include multiple components which are not electrically connected, where one component may be configured to connect to the gate electrode of the P-channel transistor 502 and another component may be configured to connect to the gate electrode of the P-channel transistor 504. The first source/drain layer 316 may be configured to electrically connect to the source/drain electrodes of the P-channel transistor 502 and 504. In addition, the N-channel transistors 506 and 508 may be fabricated in the second device layer 304. The second gate layer 324 may include multiple components which are not electrically connected, where one component may be configured to connect to the gate electrode of the N-channel transistor 506, and another component may be configured to connect to the gate electrode of the N-channel transistor 508. The second source/drain layer 326 may be configured to electrically connect to the source/drain electrodes of the N-channel transistors 506 and 508. The inter-level connection structures 332, 334, 336, 338, 340 and 342 (e.g., vias) may be used for interconnection of the N-channel transistors 506 and 508 and the P-channel transistors 502 and 504.

Figure 3B:
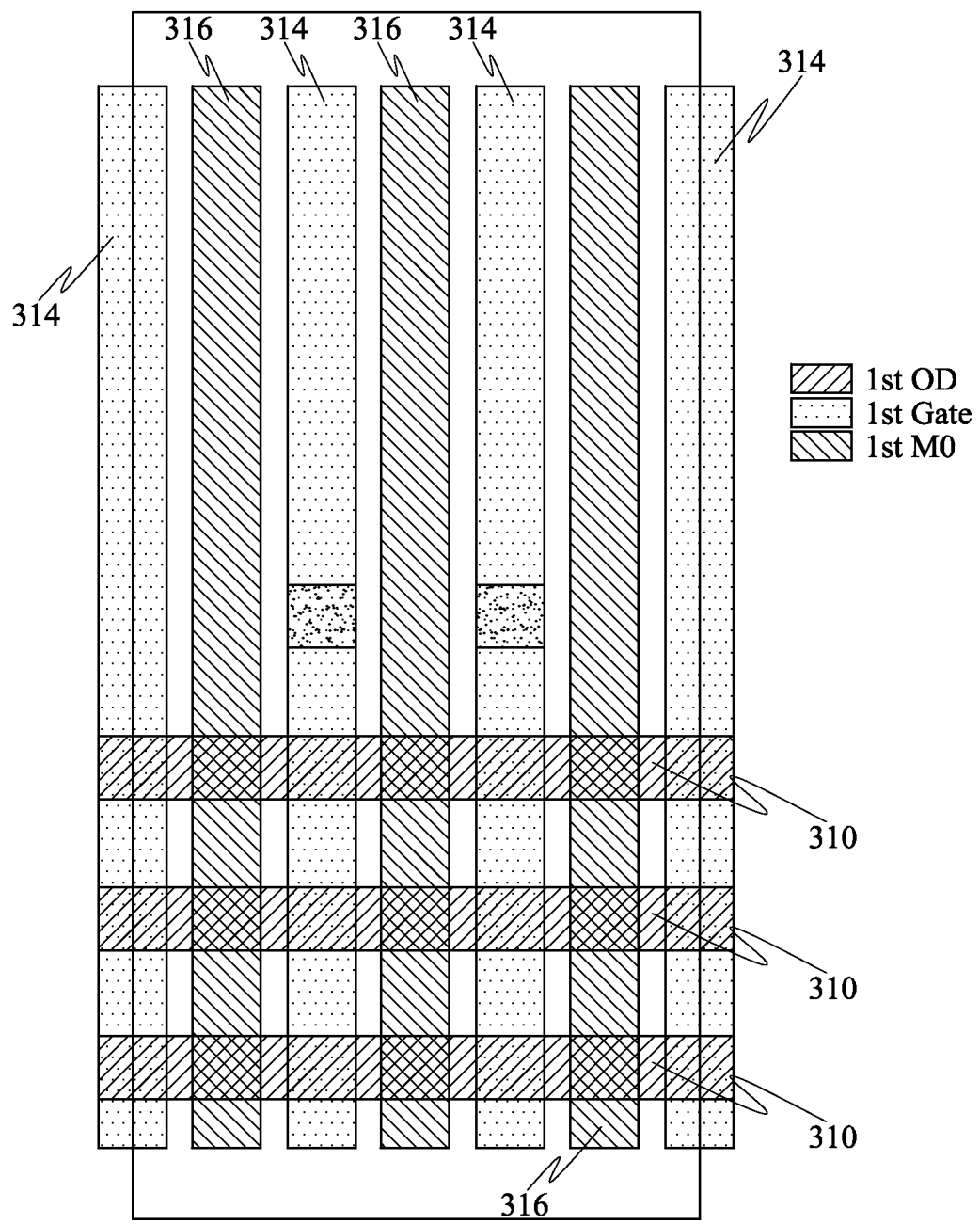

FIG. 3(B) depicts an example layout diagram of the first device layer 302 for fabricating the NAND gate 500. As shown in FIG. 3(B), the first gate layer 314 may include four components separated by three components of the first source/drain layer 316. The first gate layer 314 and the first source/drain layer 316 may extend along a same direction. The first fin structure for oxidation and diffusion 310 may include three components and extend along a direction different from (e.g., perpendicular to) that of the first gate layer 314 and the first source/drain layer 316.

Figure 3C:
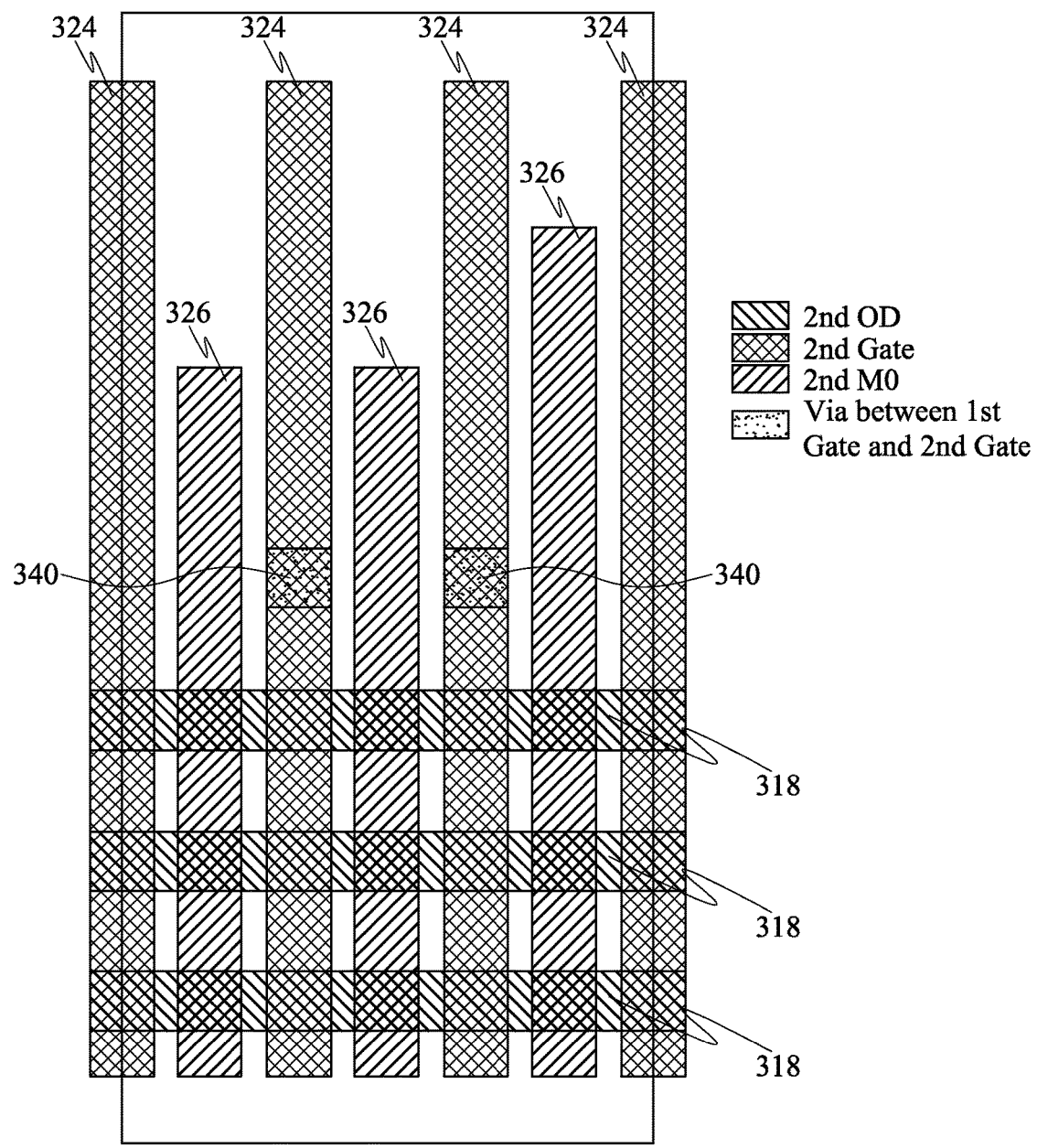

FIG. 3(C) depicts an example layout diagram of the second device layer 304 for fabricating the NAND gate 500. As shown in FIG. 3(C), four components of the second gate layer 324 may be separated by three components of the second source/drain layer 326. The second fin structure for oxidation and diffusion 318 may include three components and extend along a direction different from (e.g., perpendicular to) that of the second gate layer 314 and the second source/drain layer 326. The inter-level connection structure 340 may be configured to electrically connect the first gate layer 314 and the second gate layer 324 together.

Figure 3D:
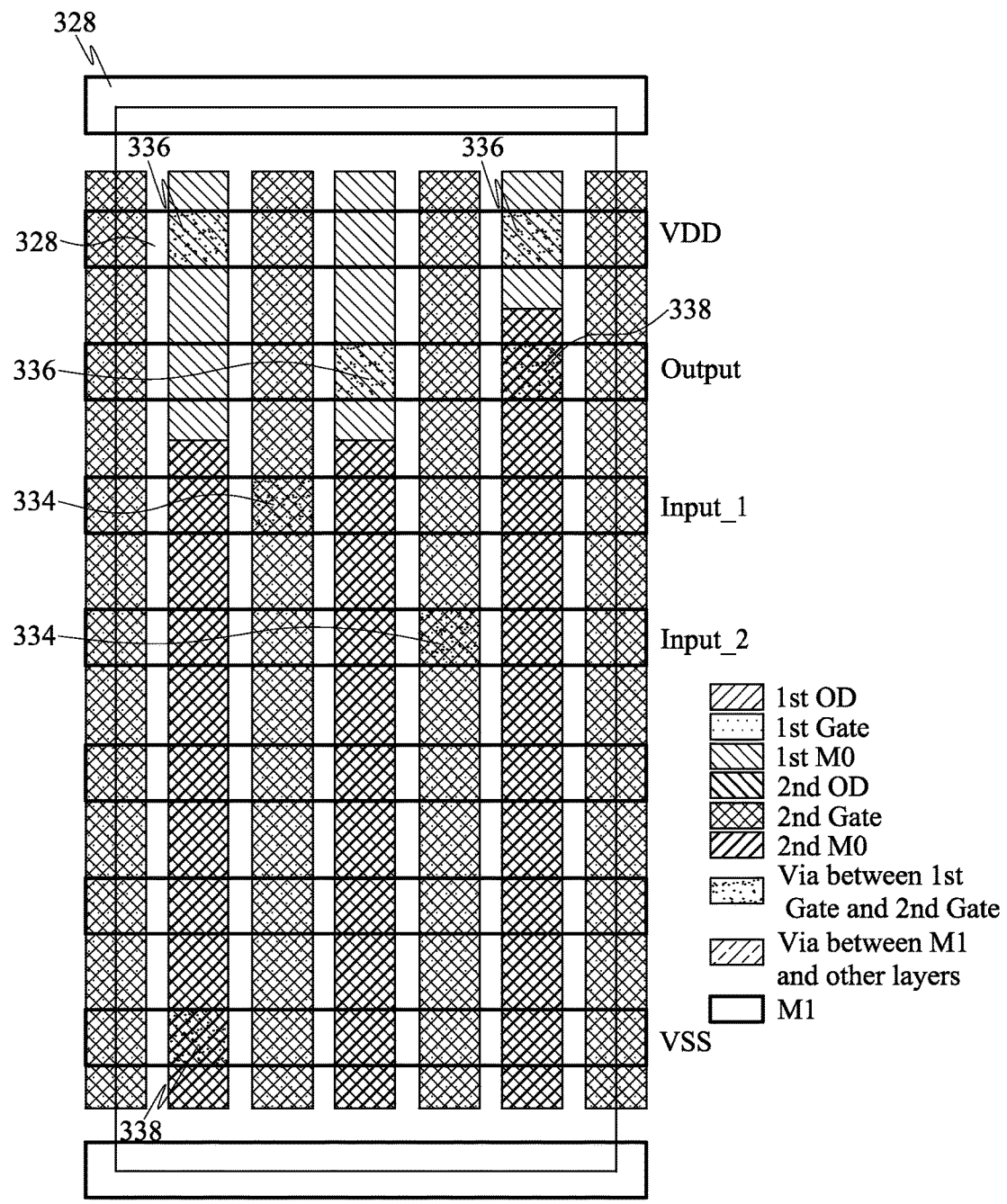

FIG. 3(D) depicts an example layout diagram of the conductive layer 328 for fabricating NAND gate 500. As shown in FIG. 3(D), the conductive layer 328 may be formed for interconnection with the first device layer 302 and the second device layer 304. For example, the inter-level connection structure 334, 336 and 338 are configured to electrically connect to the second gate layer 324, the first source/drain layer 316, and the second source/drain layer 326, respectively. As an example, the inter-level connection structure 334 may correspond to a terminal for receiving the input signal 510 (e.g., Input_1) or a terminal for receiving the input signal 512 (e.g., Input_2). Further, the inter-level connection structure 336 may correspond to a terminal for receiving the bias voltage 516 (e.g., VDD) or a terminal for providing the output signal 514 (e.g., Output), and the inter-level connection structure 338 may correspond to a terminal for receiving the bias voltage 518 (e.g., VSS).

Figure 3E:
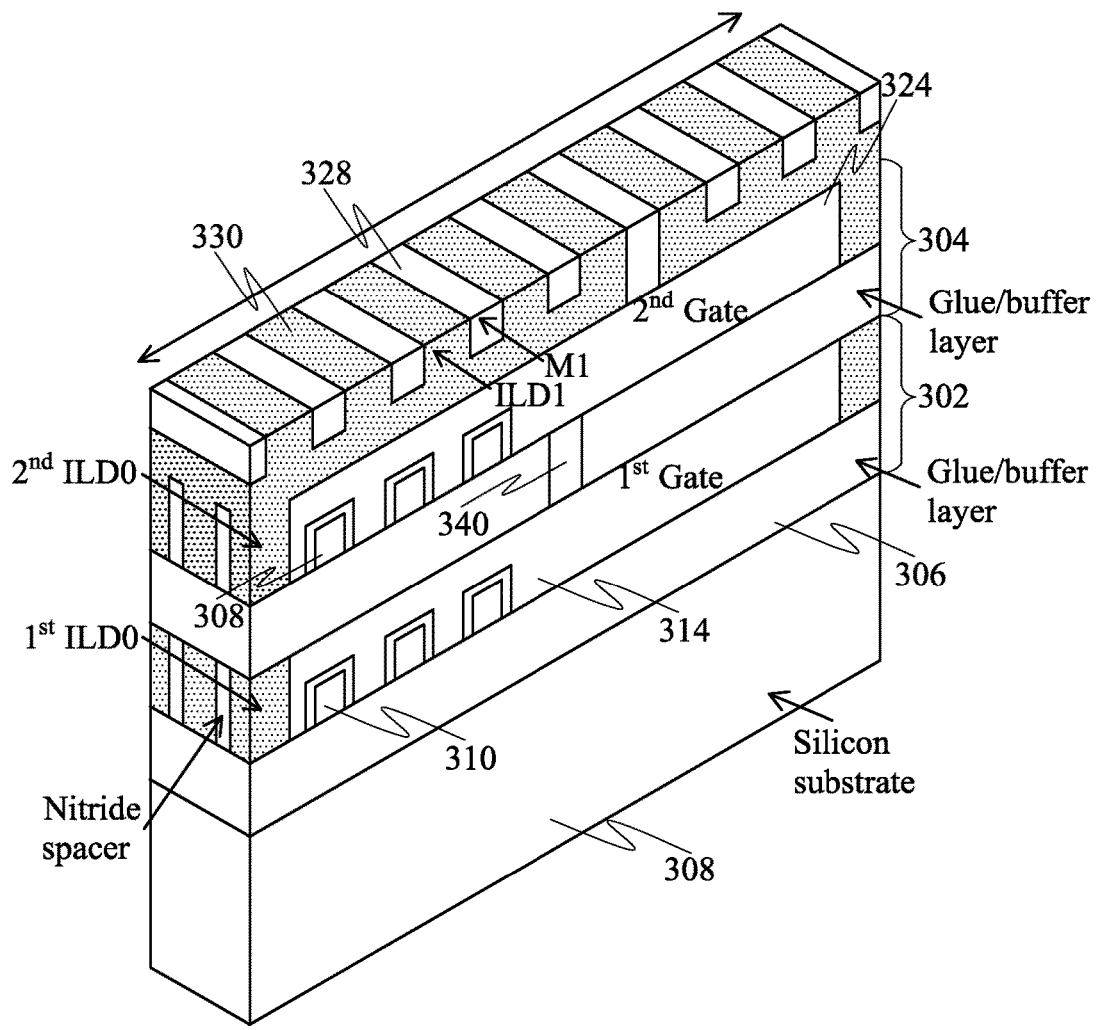

FIG. 3(E) depicts an example diagram showing a cross-section view of the multi-layer structure 300 for fabricating the NAND gate 500. As shown in FIG. 3(E), three fin structures for oxidation and diffusion (e.g., the fin structure 310) may be formed on the glue/buffer layer 306 within the first device layer 302. In addition, three fin structures for oxidation and diffusion (e.g., the fin structure 318) may be formed on the glue/buffer layer 322 within the second device layer 304. The inter-level connection structure 340 may be configured to electrically connect the first gate layer 314 and the second gate layer 324 together. The conductive layer 328 may include eight components separated by the ILD layer 330.

Figure 3F:
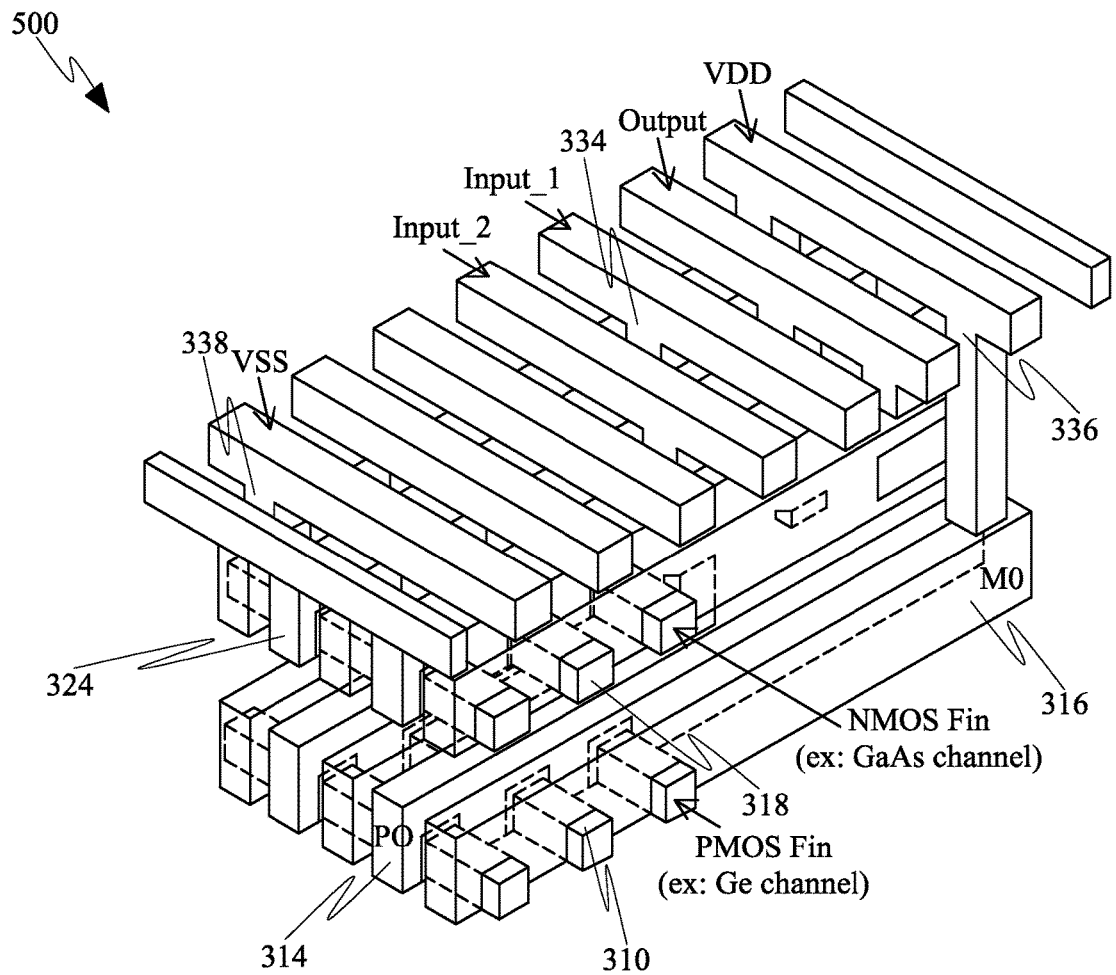

FIG. 3(F) depicts an example diagram showing certain components within the multi-layer structure 300 for fabricating the NAND gate 500. As shown in FIG. 3(F), P-channel transistors may be formed at an approximately same level based on three PMOS fin structures (e.g., including a germanium channel), the first gate layer 314, and the first source/drain layers 316. At a higher level, N-channel transistors may be formed based on three NMOS fin structures (e.g., including a gallium arsenide channel), the second gate layer 324, and the second source/drain layers 326. Multiple inter-level connection structures (e.g., the inter-level connection structures 334, 336, and 338) may be formed for interconnection of the N-channel transistors and the P-channel transistors at different levels.

Figure 3G:
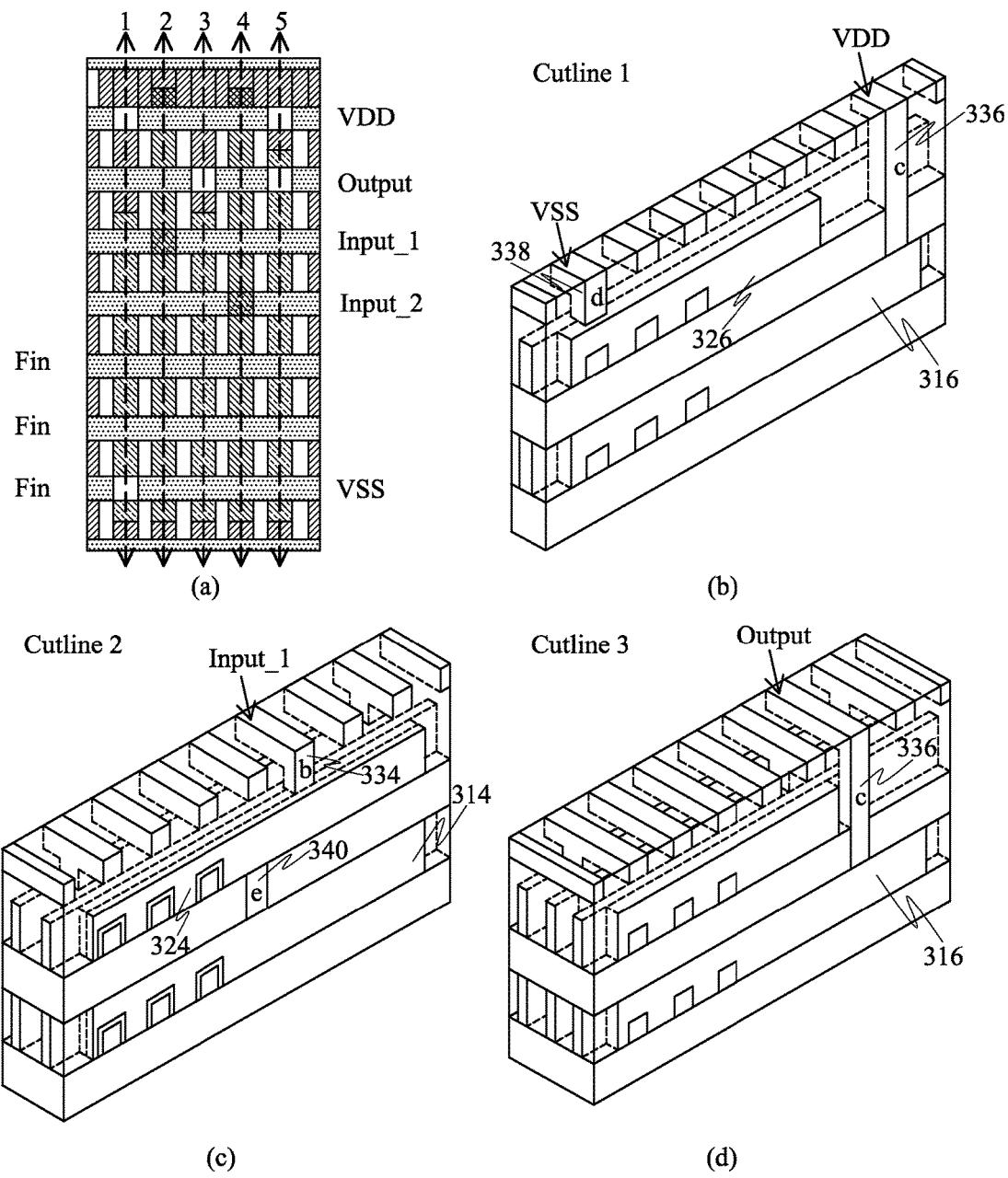
Figure 3G:
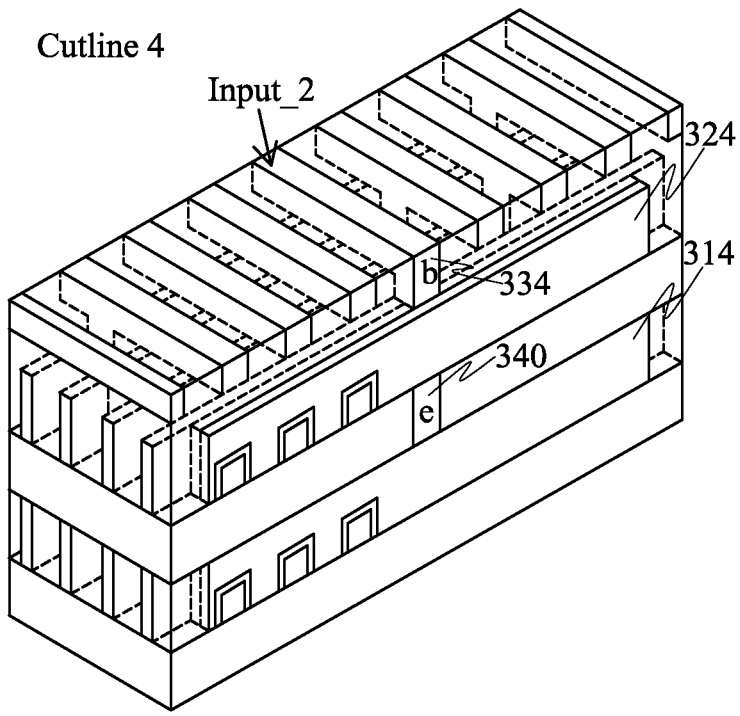
Figure 3G:
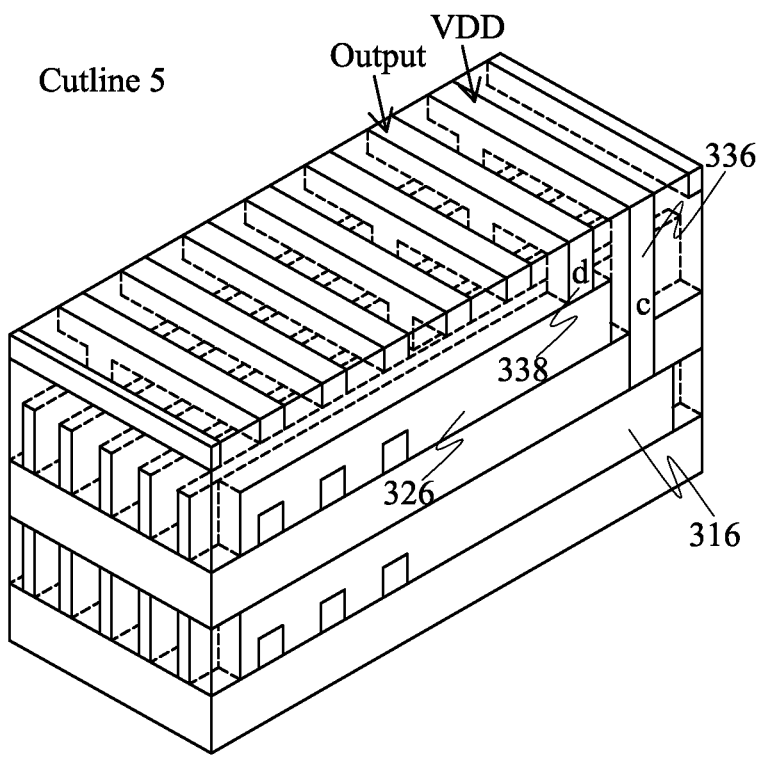

FIG. 3(G) depicts example diagrams showing cross-section views of the multi-layer structure 300 for fabricating the NAND gate 500 corresponding to cross-sections taken along different lines. FIG. 3(G)(a) shows five different lines for cross-section views on a layout of the multi-layer structure 300. For example, the layout of the multi-layer structure 300 as shown in FIG. 3(G)(a) may include a combination or superimposition of the layout diagrams shown in FIG. 3(B), FIG. 3(C), and FIG. 3(D).

A cross-section view corresponding to a cross-section taken along line "1" is shown in FIG. 3(G)(b). The inter-level connection structure 336 may connect to the first source/drain layer 316 and correspond to a terminal for receiving the bias voltage 516 (e.g., VDD). Also, the inter-level connection structure 338 may connect to the second source/drain layer 326 and correspond to a terminal for receiving the bias voltage 518 (e.g., VSS). For example, the first source/drain layer 316 may be configured to electrically connect to the source electrode of the P-channel transistor 502 or the source electrode of the P-channel transistor 504 as shown in FIG. 3(A). In another example, the second source/drain layer 326 may be configured to electrically connect to the source electrode of the N-channel transistor 506 as shown in FIG. 3(A).

FIG. 3(G)(c) shows a cross-section view corresponding to a cross-section taken along line "2." The inter-level connection structure 340 may connect the first gate layer 314 and the second gate layer 324 together. In addition, the inter-level connection structure 334 may connect to the second gate layer 324 and correspond to a terminal for receiving the input signal 510 (e.g., Input_1). For example, the second gate layer 324 may be configured to electrically connect to the gate electrode of the N-channel transistor 506, and the first gate layer 314 may be configured to electrically connect to the gate electrode of the P-channel transistor 502, as shown in FIG. 3(A).

Furthermore, a cross-section view corresponding to a cross-section taken along line "3" is shown in FIG. 3(G)(d). The inter-level connection structure 336 may connect to the first source/drain layer 316 and correspond to a terminal for providing the output signal 514 (e.g., Output). For example, the first source/drain layer 316 may be configured to electrically connect to the drain electrode of the P-channel transistor 502 or the drain electrode of the P-channel transistor 504 as shown in FIG. 3(A).

FIG. 3(G)(e) shows a cross-section view corresponding to a cross-section taken along line "4." The inter-level connection structure 340 may connect the first gate layer 314 and the second gate layer 324 together. In addition, the inter-level connection structure 334 may connect to the second gate layer 324 and correspond to a terminal for receiving the input signal 512 (e.g., Input_2). For example, the second gate layer 324 may be configured to electrically connect to the gate electrode of the N-channel transistor 508, and the first gate layer 314 may be configured to electrically connect to the gate electrode of the P-channel transistor 504, as shown in FIG. 3(A).

A cross-section view corresponding to a cross-section taken along line "4" is shown in FIG. 3(G)(f). The inter-level connection structure 336 may connect to the first source/drain layer 316 and correspond to a terminal for receiving the bias voltage 516 (e.g., VDD). Also, the inter-level connection structure 338 may connect to the second source/drain layer 326 and correspond to a terminal for providing the output signal 514 (e.g., Output). For example, the first source/drain layer 316 may be configured to electrically connect to the source electrode of the P-channel transistor 502 or the source electrode of the P-channel transistor 504 as shown in FIG. 3(A). In another example, the second source/drain layer 326 may be configured to electrically connect to the source electrode of the N-channel transistor 508 as shown in FIG. 3(A).

Figure 4A:
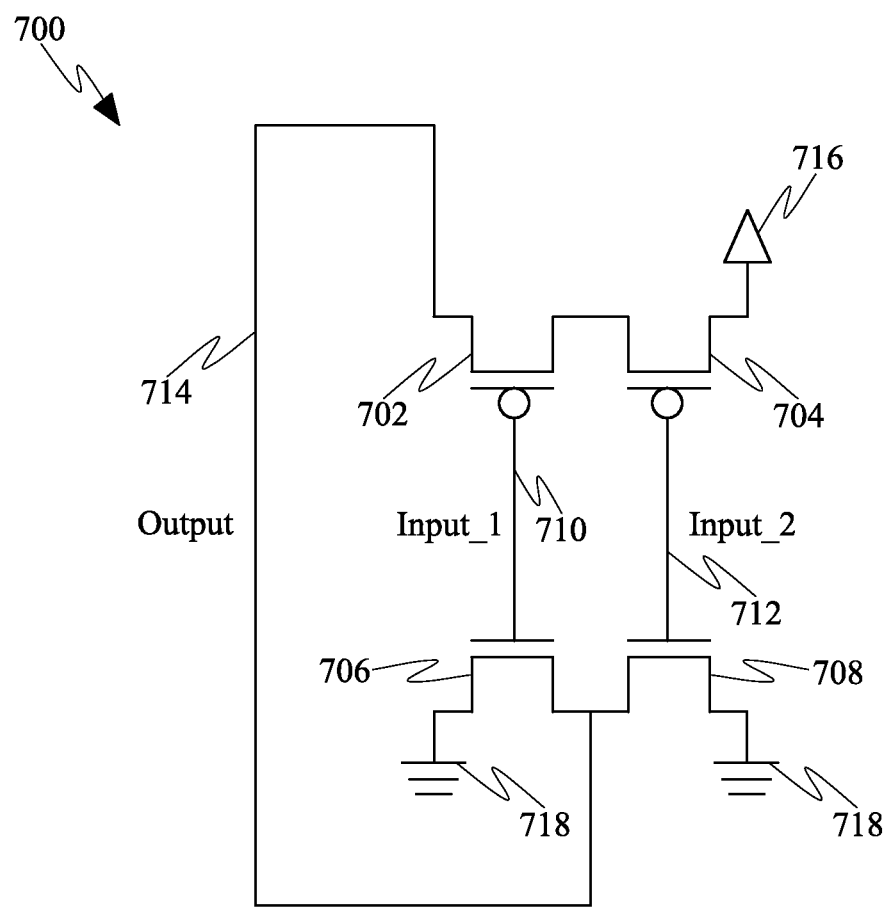
FIGS. 4(A)-4(G) depict example diagrams of a NOR gate fabricated using a multi-layer semiconductor device structure.

FIG. 4(A) depicts an example schematic diagram of a NOR gate. As shown in FIG. 4(A), the NOR gate 700 includes two P-channel transistors 702 and 704 (e.g., P-channel MOSFETs) and two N-channel transistor 706 and 708 (e.g., N-channel MOSFETs). The P-channel transistors 702 and 704 and the N-channel transistors 706 and 708 each include a gate electrode associated with a gate electrode structure, a source electrode associated with a source region and a drain electrode associated with a drain region. The gate electrode of the P-channel transistor 702 may be configured to electrically connect to the gate electrode of the N-channel transistor 706 and receive an input signal 710 (e.g., Input_1). Also, the gate electrode of the P-channel transistor 704 may be configured to electrically connect to the gate electrode of the N-channel transistor 708 and receive another input signal 712 (e.g., Input_2). An output signal 714 may be generated by the NOR gate 700 in response to the input signals 710 and 712. The source electrodes of the N-channel transistors 706 and 708 may be biased at a predetermined voltage 718 (e.g., VSS), and the source electrode of the P-channel transistor 716 may be biased at another predetermined voltage 716 (e.g., VDD). For example, the voltage 716 may be higher than the voltage 718.

Table 3 shows a truth table for the NOR gate 700, where the output signal 714 corresponds to a logic value (e.g., 0, 1) determined according to the input signals 710 and 712.

TABLE 3

| Input 1 | Input 2 | Output |
|---------|---------|--------|
| 0 | 0 | 1 |
| 0 | 1 | 0 |
| 1 | 0 | 0 |
| 1 | 1 | 0 |

Referring to FIG. 1(C) and FIG. 4(A), similar to the NAND gate 500, the P-channel transistors 702 and 704 may be fabricated in the first device layer 302, and the N-channel transistors 706 and 708 may be fabricated in the second device layer 304. The inter-level connection structures 332, 334, 336, 338, 340 and 342 (e.g., vias) may be used for interconnection of the N-channel transistors 706 and 708 and the P-channel transistors 702 and 704.

Figure 4B:
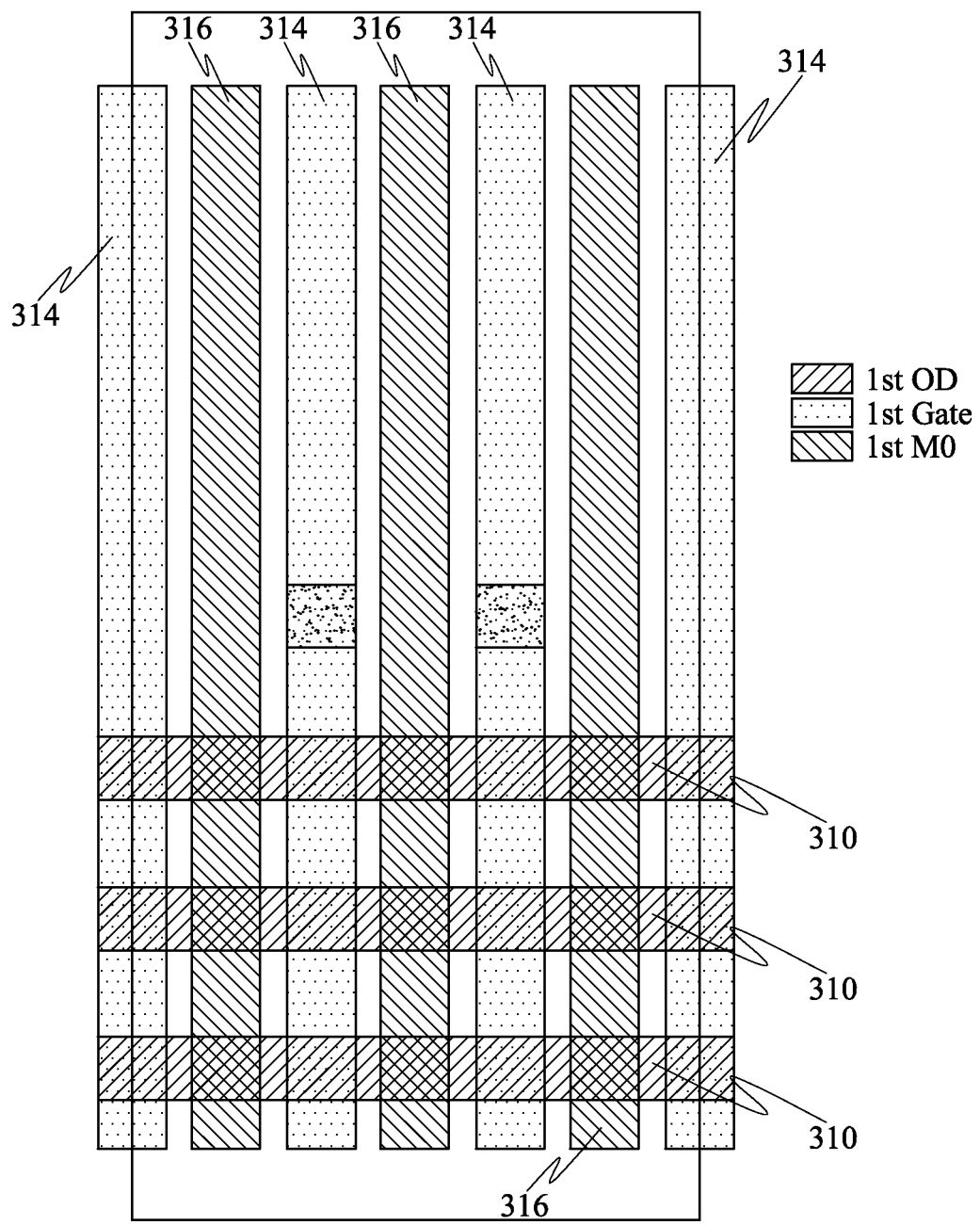

FIG. 4(B) depicts an example layout diagram of the first device layer 302 for fabricating the NOR gate 700. As shown in FIG. 4(B), the first gate layer 314 may include four components separated by three components of the first source/drain layer 316. The first gate layer 314 and the first source/drain layer 316 may extend along a same direction. The first fin structure for oxidation and diffusion 310 may include three components and extend along a direction different from (e.g., perpendicular to) that of the first gate layer 314 and the first source/drain layer 316.

Figure 4C:
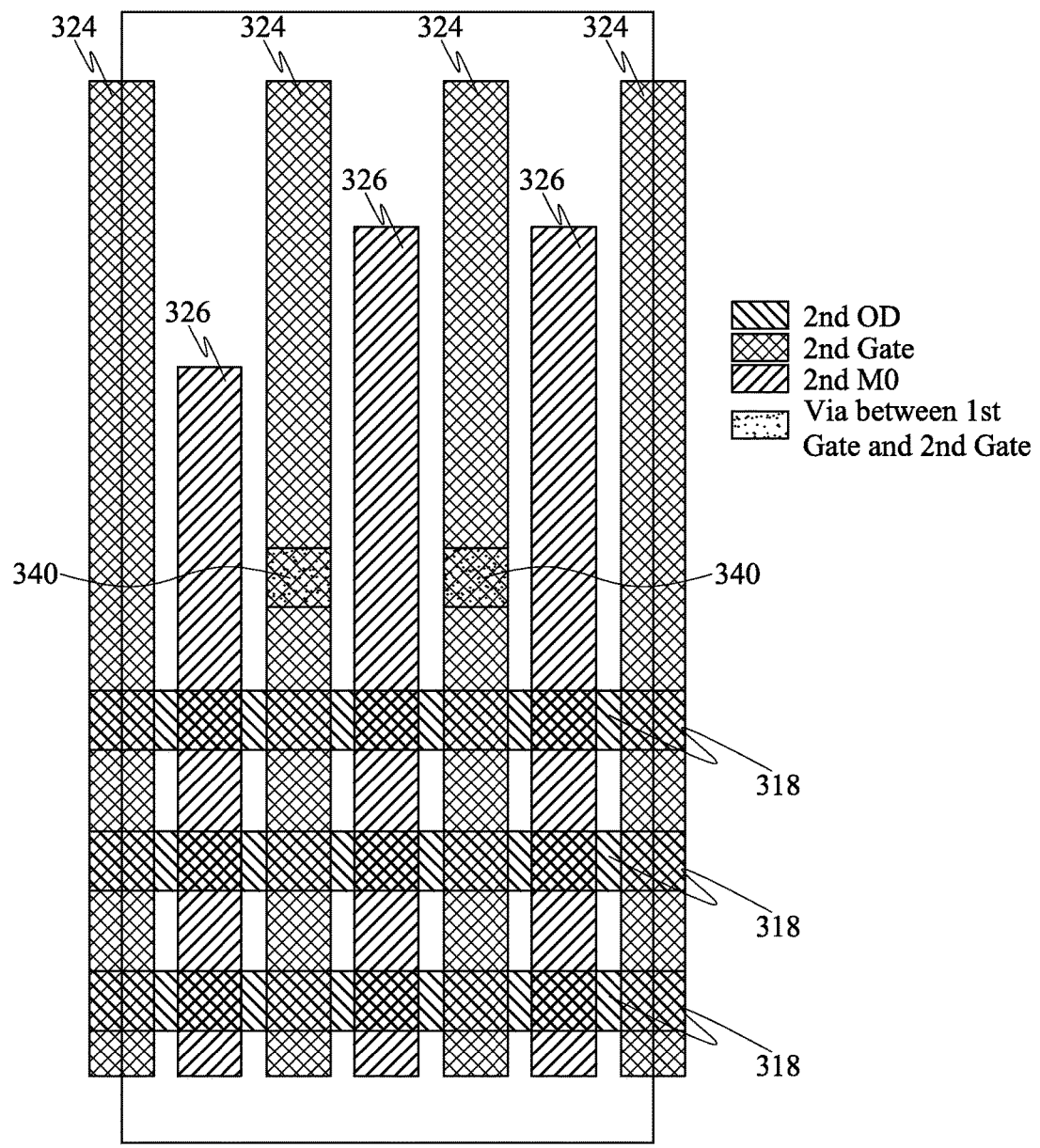

FIG. 4(C) depicts an example layout diagram of the second device layer 304 for fabricating the NOR gate 700. As shown in FIG. 4(C), four components of the second gate layer 324 may be separated by three components of the second source/drain layer 326. The second fin structure for oxidation and diffusion 318 may include three components and extend along a direction different from (e.g., perpendicular to) that of the second gate layer 314 and the second source/drain layer 326. The inter-level connection structure 340 may be configured to electrically connect the first gate layer 314 and the second gate layer 324 together.

Figure 4D:
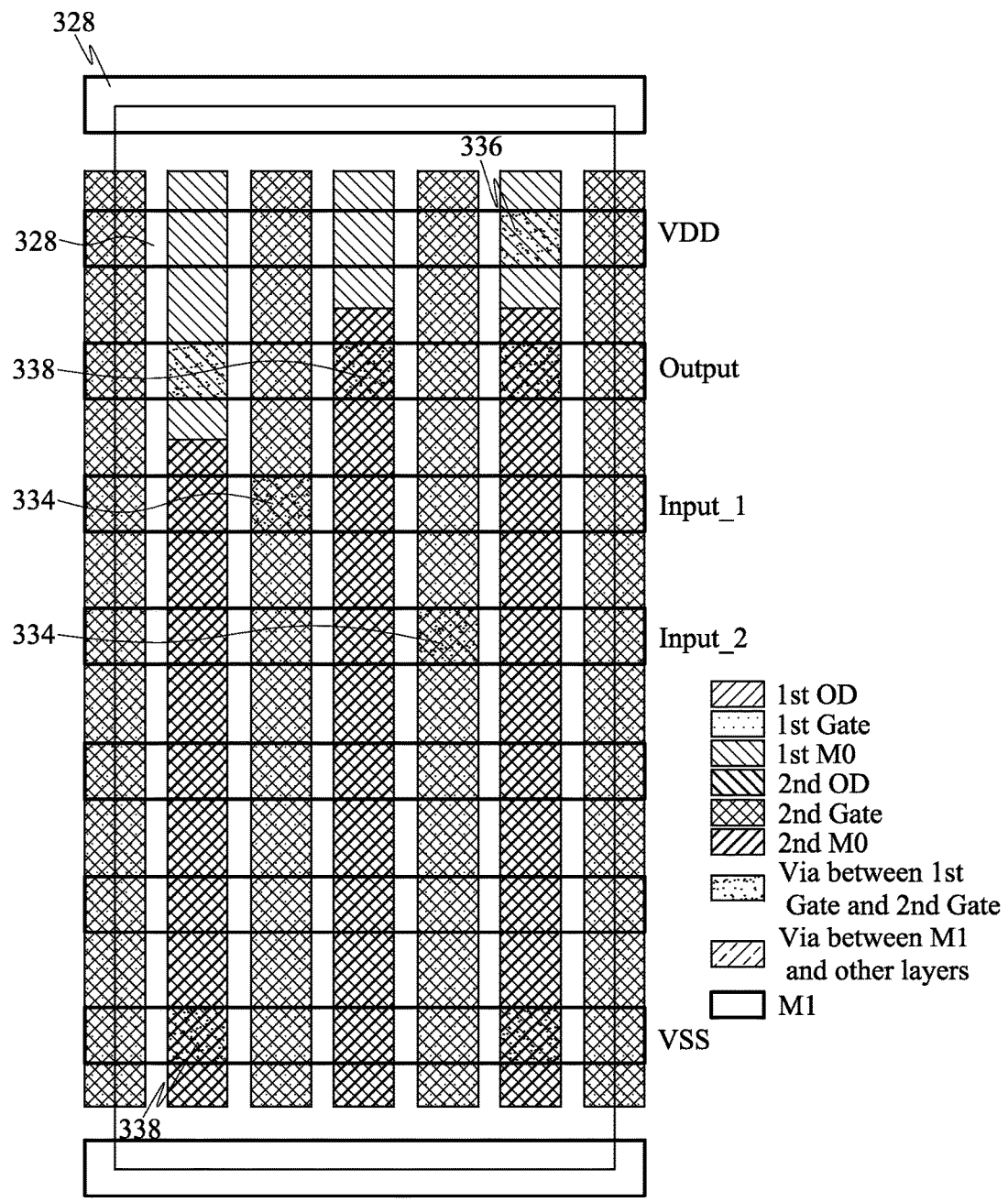

FIG. 4(D) depicts an example layout diagram of the conductive layer 328 for fabricating NOR gate 500. As shown in FIG. 4(D), the conductive layer 328 may be formed for interconnection with the first device layer 302 and the second device layer 304. For example, the inter-level connection structure 334, 336 and 338 are configured to electrically connect to the second gate layer 324, the first source/drain layer 316, and the second source/drain layer 326, respectively. As an example, the inter-level connection structure 334 may correspond to a terminal for receiving the input signal 710 (e.g., Input_1) or a terminal for receiving the input signal 712 (e.g., Input_2). Further, the inter-level connection structure 336 may correspond to a terminal for receiving the bias voltage 716 (e.g., VDD). The inter-level connection structure 338 may correspond to a terminal for receiving the bias voltage 718 (e.g., VSS) or a terminal for providing the output signal 714 (e.g., Output).

Figure 4E:
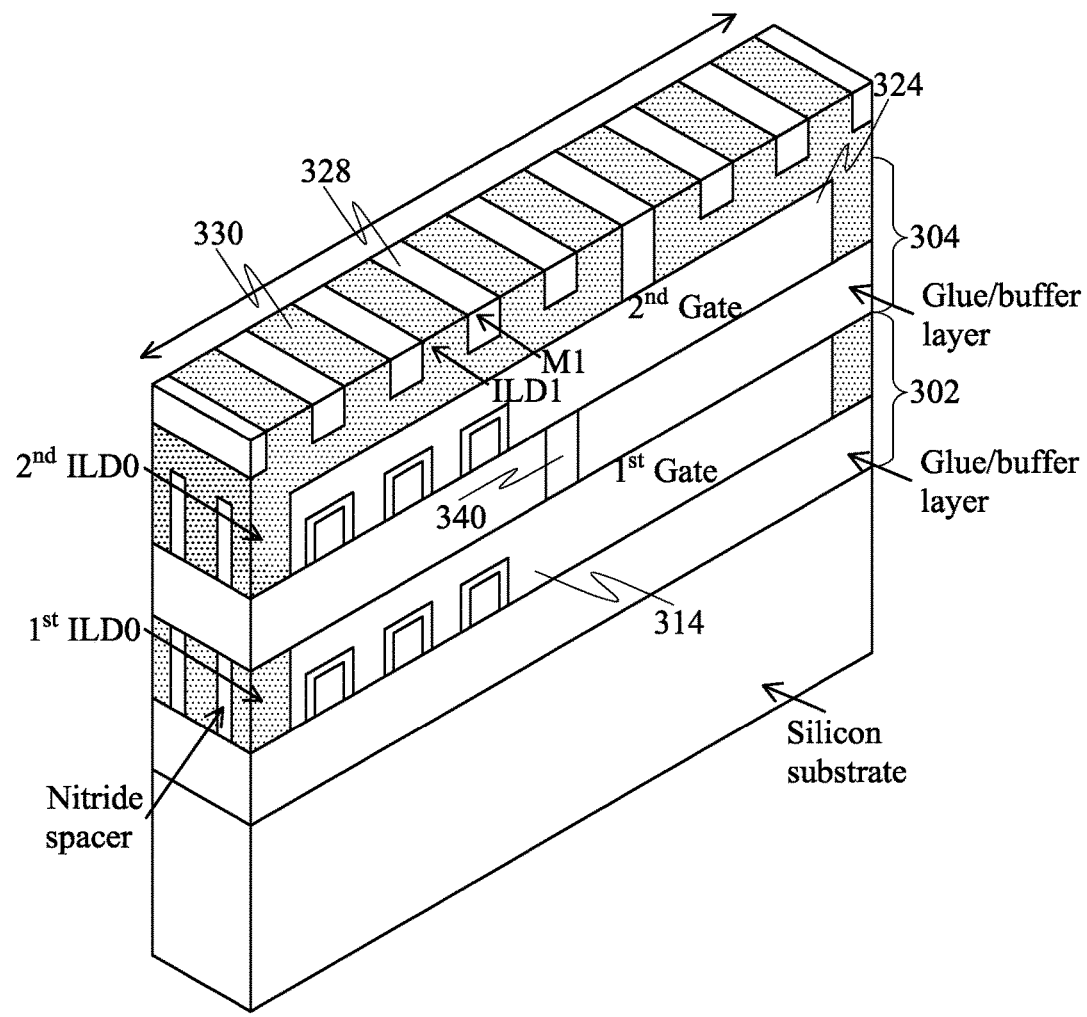

FIG. 4(E) depicts an example diagram showing a cross-section view of the multi-layer structure 300 for fabricating the NOR gate 700. As shown in FIG. 4(E), the first device layer 302 and the second device layer 304 may each include three fin structures for oxidation and diffusion. The inter-level connection structure 340 may be configured to electrically connect the first gate layer 314 and the second gate layer 324 together. The conductive layer 328 may include eight components separated by the ILD layer 330.

Figure 4F:
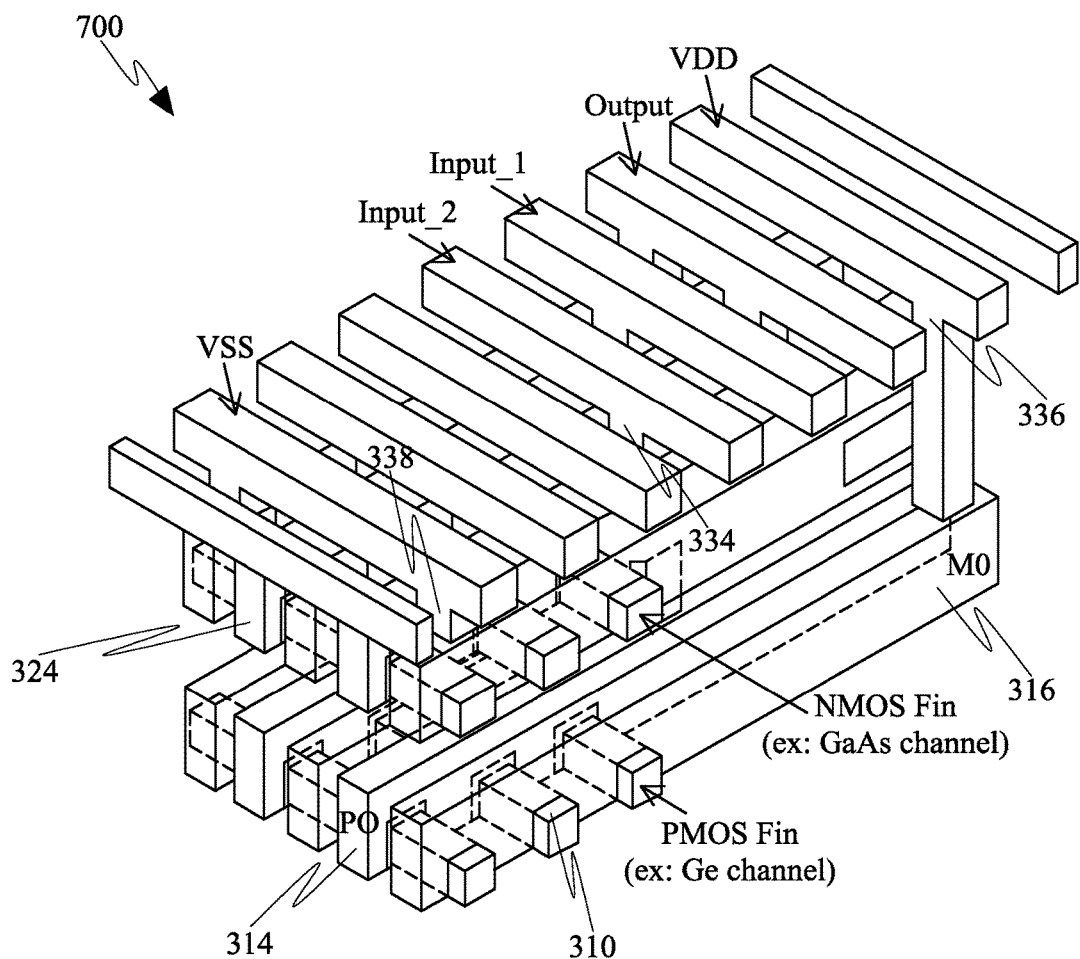

FIG. 4(F) depicts an example diagram showing certain components within the multi-layer structure 300 for fabricating the NOR gate 700. As shown in FIG. 4(F), P-channel transistors and N-channel transistors may be formed at different levels. The P-channel transistors may be formed at a lower level based on three PMOS fin structures (e.g., including a germanium channel), the first gate layer 314, and the first source/drain layers 316, and the N-channel transistors may be formed at a higher level based on three NMOS fin structures (e.g., including a gallium arsenide channel), the second gate layer 324, and the second source/drain layers 326. Multiple inter-level connection structures (e.g., the inter-level connection structures 334, 336, 338) may be formed for interconnection of the N-channel transistors and the P-channel transistors.

Figure 4G:
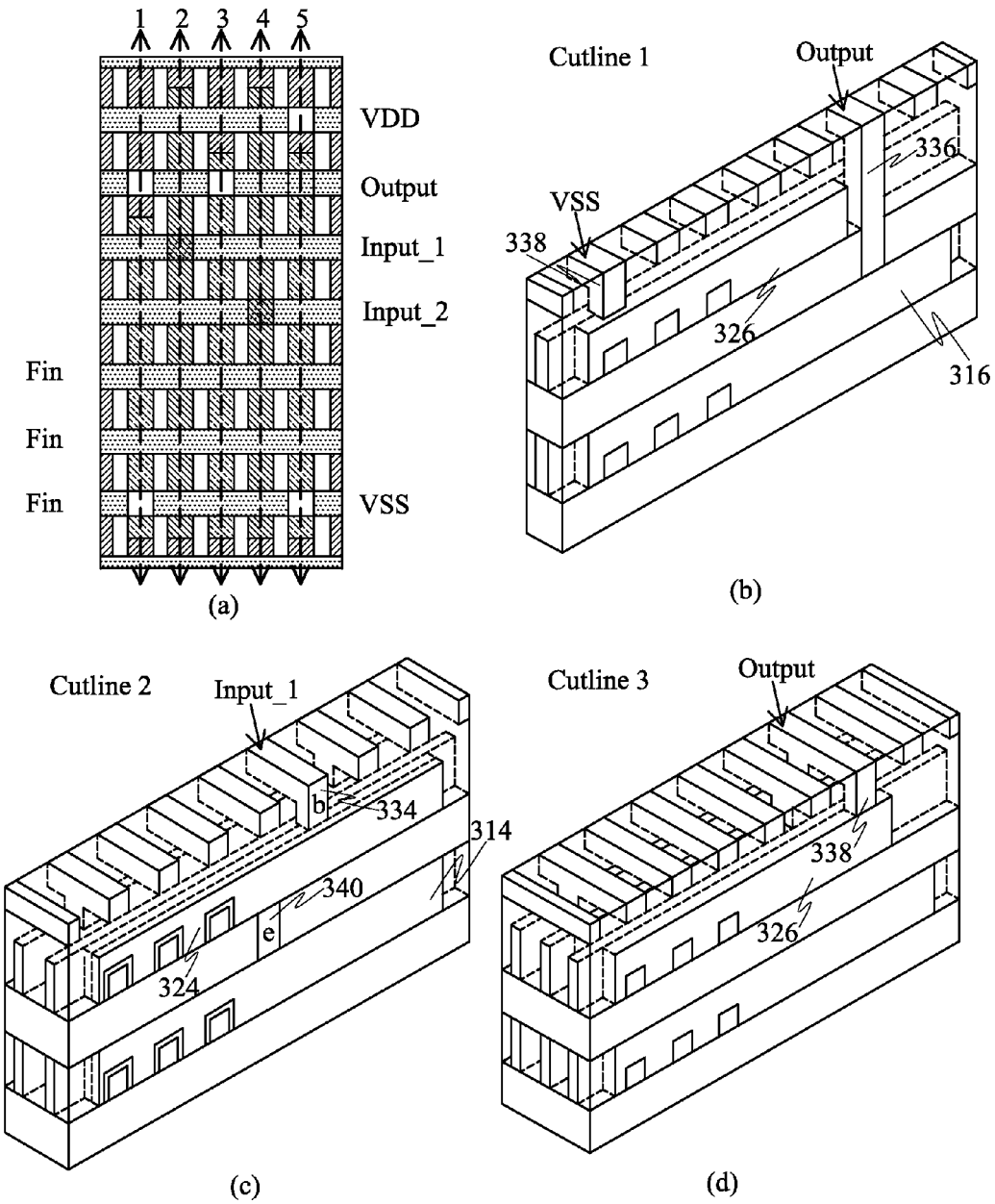
Figure 4G:
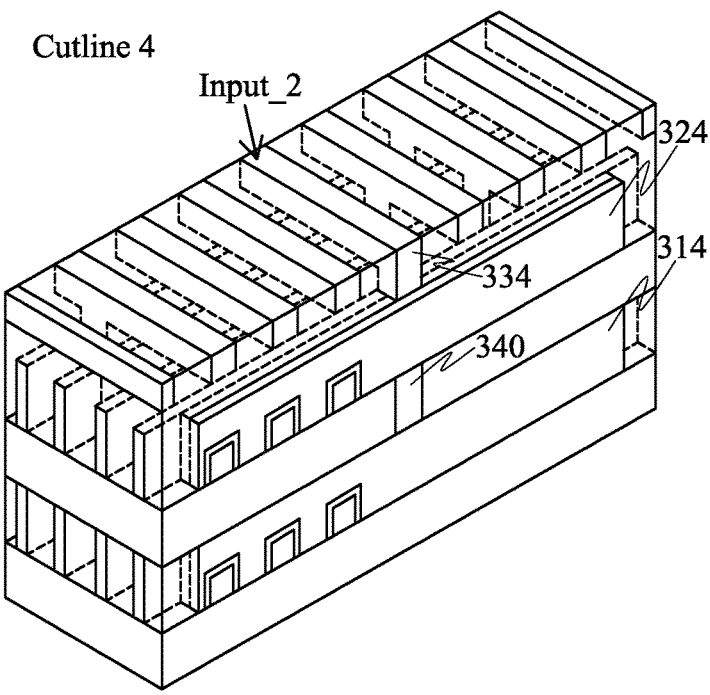
Figure 4G:
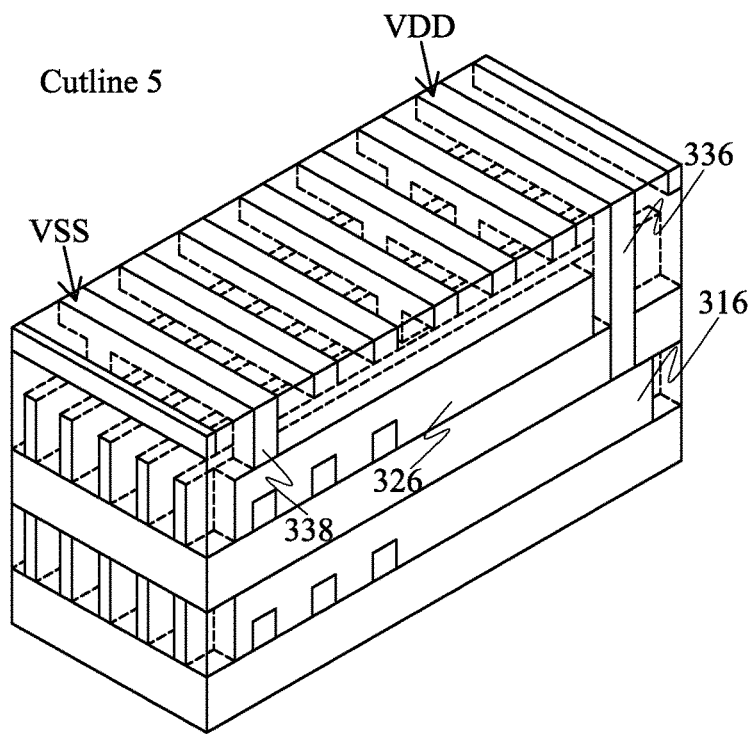

FIG. 4(G) depicts example diagrams showing cross-section views of the multi-layer structure 300 for fabricating the NOR gate 700 corresponding to cross-sections taken along different lines. FIG. 4(G)(a) shows five different lines for cross-section views on a layout of the multi-layer structure 300. For example, the layout of the multi-layer structure 300 as shown in FIG. 4(G)(a) may include a combination or superimposition of the layout diagrams shown in FIG. 4(B), FIG. 4(C), and FIG. 4(D).

A cross-section view corresponding to a cross-section taken along line "1" is shown in FIG. 4(G)(b). The inter-level connection structure 336 may connect to the first source/drain layer 316 and correspond to a terminal for providing the output signal 714 (e.g., Output). Also, the inter-level connection structure 338 may connect to the second source/drain layer 326 and correspond to a terminal for receiving the bias voltage 718 (e.g., VSS). For example, the first source/drain layer 316 may be configured to electrically connect to the source electrode of the P-channel transistor 702 as shown in FIG. 4(A). In another example, the second source/drain layer 326 may be configured to electrically connect to the source electrode of the N-channel transistor 706 or the source electrode of the N-channel transistor 708 as shown in FIG. 4(A).

FIG. 4(G)(c) shows a cross-section view corresponding to a cross-section taken along line "2." The inter-level connection structure 340 may connect the first gate layer 314 and the second gate layer 324 together. In addition, the inter-level connection structure 334 may connect to the second gate layer 324 and correspond to a terminal for receiving the input signal 710 (e.g., Input_1). For example, the second gate layer 324 may be configured to electrically connect to the gate electrode of the N-channel transistor 706, and the first gate layer 314 may be configured to electrically connect to the gate electrode of the P-channel transistor 702, as shown in FIG. 4(A).

Furthermore, a cross-section view corresponding to a cross-section taken along line "3" is shown in FIG. 4(G)(d). The inter-level connection structure 338 may connect to the second source/drain layer 326 and correspond to a terminal for providing the output signal 714 (e.g., Output). For example, the second source/drain layer 326 may be configured to electrically connect to the drain electrode of the N-channel transistor 706 or the drain electrode of the N-channel transistor 708 as shown in FIG. 4(A).

FIG. 4(G)(e) shows a cross-section view corresponding to a cross-section taken along line "4." The inter-level connection structure 340 may connect the first gate layer 314 and the second gate layer 324 together. In addition, the inter-level connection structure 334 may connect to the second gate layer 324 and correspond to a terminal for receiving the input signal 712 (e.g., Input_2). For example, the second gate layer 324 may be configured to electrically connect to the gate electrode of the N-channel transistor 708, and the first gate layer 314 may be configured to electrically connect to the gate electrode of the P-channel transistor 704, as shown in FIG. 4(A).

A cross-section view corresponding to a cross-section taken along line "5" is shown in FIG. 4(G)(f). The inter-level connection structure 336 may connect to the first source/drain layer 316 and correspond to a terminal for receiving the bias voltage 716 (e.g., VDD). Also, the inter-level connection structure 338 may connect to the second source/drain layer 326 and correspond to a terminal for receiving the bias voltage 718 (e.g., VSS). For example, the first source/drain layer 316 may be configured to electrically connect to the source electrode of the P-channel transistor 704 as shown in FIG. 4(A). In another example, the second source/drain layer 326 may be configured to electrically connect to the source electrode of the N-channel transistor 706 or the source electrode of the N-channel transistor 708 as shown in FIG. 4(A).

The layout diagrams shown in FIG. 2(B), FIG. 2(C), FIG. 2(D), FIG. 3(B), FIG. 3(C), FIG. 3(D), FIG. 4(B), FIG. 4(C), and FIG. 4(D) are merely examples, which should not unduly limit the scope of the claims. One of ordinary skill in the art would recognize many variations, alternatives, and modifications. For example, each of the layout diagrams shown in FIG. 2(B), FIG. 2(C), FIG. 2(D), FIG. 3(B), FIG. 3(C), FIG. 3(D), FIG. 4(B), FIG. 4(C), and FIG. 4(D) may be realized through one or more masks. As an example, different elements in the layout diagrams and the spatial relationship of these elements shown in FIG. 2(B), FIG. 2(C), FIG. 2(D), FIG. 3(B), FIG. 3(C), FIG. 3(D), FIG. 4(B), FIG. 4(C), and FIG. 4(D) are not necessarily drawn to scale.

Figure 5:
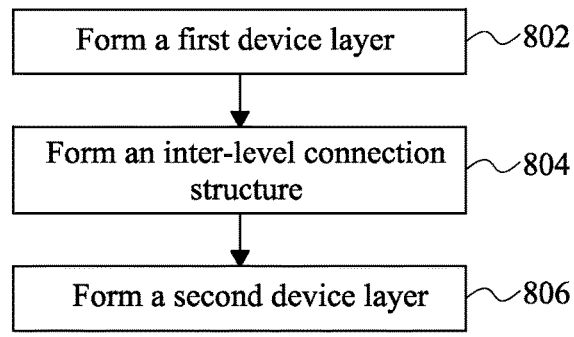
FIG. 5 depicts an example flow chart for fabricating a semiconductor device structure.

FIG. 5 depicts an example flow chart for fabricating a semiconductor device structure. As shown in FIG. 5, a first device layer including a first semiconductor device is formed on a substrate, at 802. The first semiconductor device includes a first electrode structure. At 804, an inter-level connection structure including one or more conductive materials is formed. The inter-level connection structure is electrically connected to the first electrode structure. At 806, a second device layer including a second semiconductor device is formed on the first device layer. The second semiconductor device includes a second electrode structure electrically connected to the inter-level connection structure.

Figure 6:
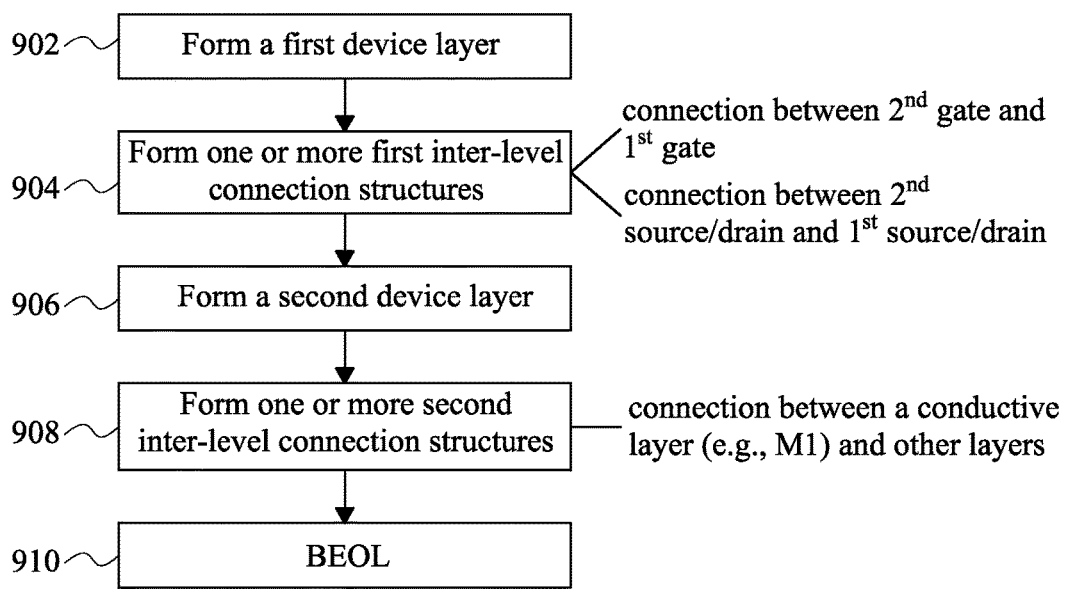
FIG. 6 depicts another example flow chart for fabricating a semiconductor device structure.

FIG. 6 depicts another example flow chart for fabricating a semiconductor device structure. As shown in FIG. 6, a first device layer including a first transistor is formed on a substrate, at 902. The first transistor includes a first gate electrode structure, a first source electrode structure, and a first drain electrode structure. At 904, one or more first inter-level connection structures including one or more conductive materials are formed. At 906, a second device layer including a second transistor is formed on the first device layer. The second transistor includes a second gate electrode structure, a second source electrode structure, and a second drain electrode structure. The first inter-level connection structures may connect the first gate electrode structure to the second gate electrode structure, or connect the first source/drain electrode structure to the second source/drain electrode structure. At 908, one or more second inter-level connection structures including one or more conductive materials are formed. At 910, one or more BEOL processes are performed to form a conductive layer (e.g., a metal layer). The second inter-level connection structures may connect the conductive layer to other layers within the first device layer or the second device layer.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein may be interchangeable as a result of transistors with "source" and "drain" being symmetrical devices. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor device structure comprising:
   a first device layer formed on a surface of a substrate and including a first semiconductor device, the first semiconductor device including a first transistor that has a first gate electrode structure, a first source electrode structure, and a first drain electrode structure;
   a second device layer formed on the first device layer and including a second semiconductor device, the second semiconductor device including a second transistor that has a second source electrode structure, a second drain electrode structure, and a second channel and a second gate electrode structure that are between the second source electrode structure and the second drain electrode structure, the second gate electrode structure having a top surface that is above the second channel and a bottom surface that is opposite to the top surface;
   a first inter-level connection structure substantially perpendicular to the surface of the substrate, including one or more first conductive materials, and extending from the first gate electrode structure to the bottom surface of the second gate electrode structure;
   a third semiconductor device formed in the first device layer and including a third transistor that has a third drain electrode structure and a third electrode structure, wherein the third drain electrode structure is configured to electrically connect to the first drain electrode structure;
   a fourth semiconductor device formed in the second device layer and including a fourth transistor that has a fourth source electrode structure and a fourth electrode structure, wherein the fourth source electrode structure is configured to electrically connect to the second drain electrode structure; and
   a second inter-level connection structure including one or more second conductive materials and configured to electrically connect to the third electrode structure and the fourth electrode structure.

2. The semiconductor device structure of claim 1, wherein at least one of the second source electrode structure and the second drain electrode structure has a bottom surface that lies in a same horizontal plane substantially parallel to the surface of the substrate as the bottom surface of the second gate electrode structure.

3. The semiconductor device structure of claim 1, wherein:
   the first source electrode structure is configured to receive a first predetermined voltage;
   the second source electrode structure is configured to receive a second predetermined voltage;
   the first gate electrode structure and the second gate electrode structure are configured to receive an input signal; and
   the first drain electrode structure and the third drain electrode structure are configured to provide an output signal.

4. The semiconductor device structure of claim 1, further comprising a third device layer formed on the second device layer and including a conductive layer.

5. The semiconductor device structure of claim 4, further comprising:
   a second inter-level connection structure including one or more second conductive materials and configured to electrically connect to the first source electrode structure and the conductive layer; and
   a third inter-level connection structure including one or more third conductive materials and configured to electrically connect to the second source electrode structure and the conductive layer.

6. The semiconductor device structure of claim 4, further comprising:
   a second inter-level connection structure including one or more second conductive materials and configured to electrically connect to the second gate electrode structure and the conductive layer.

7. The semiconductor device structure of claim 4, further comprising:
   a second inter-level connection structure including one or more second conductive materials and configured to electrically connect to the second drain electrode structure and the conductive layer; and
   a third inter-level connection structure including one or more third conductive materials and configured to electrically connect to the first drain electrode structure and the conductive layer.

8. The semiconductor device structure of claim 1, wherein:

the third transistor further includes a third gate electrode structure and a third source electrode structure;

the fourth transistor further includes a fourth gate electrode structure and a fourth drain electrode structure;

the third gate electrode structure corresponds to the third electrode structure;

the fourth gate electrode structure corresponds to the fourth electrode structure.

9. The semiconductor device structure of claim 8, wherein:

the first source electrode structure and the third source electrode structure are configured to receive a first predetermined voltage;

the second source electrode structure is configured to receive a second predetermined voltage;

the first gate electrode structure and the second gate electrode structure are configured to receive a first input signal;

the third gate electrode structure and the fourth gate electrode structure are configured to receive a second input signal; and the first drain electrode structure and the third drain electrode structure are configured to provide an output signal.

10. The semiconductor device structure of claim 8, further comprising:

a third inter-level connection structure including one or more third conductive materials and configured to electrically connect to the first source electrode structure and the conductive layer; and a fourth inter-level connection structure including one or more fourth conductive materials and configured to electrically connect to the second source electrode structure and the conductive layer.

11. The semiconductor device structure of claim 8, further comprising:

a third inter-level connection structure including one or more third conductive materials and configured to electrically connect to the second gate electrode structure and the conductive layer.

12. The semiconductor device structure of claim 8, further comprising:

a third inter-level connection structure including one or more third conductive materials and configured to electrically connect to the first drain electrode structure and the conductive layer.

13. The semiconductor device structure of claim 8, further comprising:

a third inter-level connection structure including one or more third conductive materials and configured to electrically connect to the third source electrode structure and the conductive layer; and a fourth inter-level connection structure including one or more fourth conductive materials and configured to electrically connect to the fourth source electrode structure and the conductive layer.

14. The semiconductor device structure of claim 8, wherein:

the third source electrode structure is configured to receive a first predetermined voltage;

the second source electrode structure is configured to receive a second predetermined voltage;

the first gate electrode structure and the second gate electrode structure are configured to receive a first input signal;

the third gate electrode structure and the fourth gate electrode structure are configured to receive a second input signal; and the first drain electrode structure, the third drain electrode structure and the fourth drain electrode structure are configured to provide an output signal.

15. The semiconductor device structure of claim 14, further comprising:

a third inter-level connection structure including one or more third conductive materials and configured to electrically connect to the first source electrode structure and the conductive layer; and a fourth inter-level connection structure including one or more fourth conductive materials and configured to electrically connect to the second source electrode structure and the conductive layer.

16. The semiconductor device structure of claim 14, further comprising:

a third inter-level connection structure including one or more third conductive materials and configured to electrically connect to the second drain electrode structure and the conductive layer.

17. The semiconductor device structure of claim 1, further comprising a P-channel transistor and a N-channel transistor, wherein:

the third transistor is one of the P-channel transistor and the N-channel transistor; and the fourth transistor is the other of the P-channel transistor and the N-channel transistor.

18. The semiconductor device structure of claim 1, further comprising a P-channel transistor and a N-channel transistor, wherein:

the first transistor is one of the P-channel transistor and the N-channel transistor; and the second transistor is the other of the P-channel transistor and the N-channel transistor.

19. A method for fabricating a semiconductor device structure, the method comprising:

forming a first device layer including a first semiconductor device on a surface of a substrate, the first semiconductor device including a first electrode structure and a first drain electrode structure;

forming an inter-level connection structure substantially perpendicular to the surface of the substrate and including one or more conductive materials, the inter-level connection structure being electrically connected to the first electrode structure;

forming a second device layer including a second semiconductor device on the first device layer, the second semiconductor device including a second transistor that has a second source electrode structure, a second drain electrode structure, and a second channel and a second gate electrode structure that are between the second source electrode structure and the second drain electrode structure, the second gate electrode structure having a top surface that is above the second channel and a bottom surface that is opposite to the top surface and that is electrically connected to the inter-level connection structure;

forming in the first device layer a third semiconductor device including a third transistor having a third electrode structure and a third drain electrode structure electrically connected to the first drain electrode structure;

forming in the second device layer a fourth semiconductor device including a fourth transistor having a fourth electrode and a fourth source electrode structure electrically connected to the second drain electrode structure; and forming a second inter-level connection structure including one or more second conductive materials, the second inter-level connection being electrically connected to the third electrode structure and the fourth electrode structure.

20. A semiconductor device structure comprising:
a first device layer;
a first semiconductor device formed in the first device layer and including a first transistor having a first drain electrode structure;
a second device layer above the first device layer;
a second semiconductor device formed in the second device layer and including a second transistor having a second channel, a second drain electrode structure, and a second gate electrode structure that has top and bottom surfaces, wherein the top surface of the second gate electrode structure is above the second channel;
a via in direct contact with the first semiconductor device and the bottom surface of the second gate electrode structure;
a third semiconductor device formed in the first device layer and including a third transistor having a third electrode structure and a third drain electrode structure, wherein the third drain electrode structure is electrically connected to the first drain electrode structure;
a fourth semiconductor device formed in the second device layer and including a fourth transistor having a fourth electrode structure and a fourth source electrode structure, wherein the fourth source electrode structure is electrically connected to the second drain electrode structure; and
a second via in direct contact with the third electrode structure and the fourth electrode structure.

* * * * *